United States Patent
Ahn et al.

(10) Patent No.: US 12,389,596 B2
(45) Date of Patent: Aug. 12, 2025

(54) SEMICONDUCTOR DEVICE AND DATA STORAGE SYSTEM INCLUDING THE SAME

(71) Applicant: Samsung Electronics Co., Ltd., Suwon-si (KR)

(72) Inventors: Jaeho Ahn, Seoul (KR); Jiwon Kim, Seoul (KR); Sungmin Hwang, Hwaseong-si (KR); Joonsung Lim, Seongnam-si (KR); Sukkang Sung, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 871 days.

(21) Appl. No.: 17/467,568

(22) Filed: Sep. 7, 2021

(65) Prior Publication Data

US 2022/0157838 A1    May 19, 2022

(30) Foreign Application Priority Data

Nov. 13, 2020 (KR) .................. 10-2020-0151779

(51) Int. Cl.
*H10B 43/27* (2023.01)
*H01L 23/522* (2006.01)
(Continued)

(52) U.S. Cl.
CPC ......... *H10B 41/35* (2023.02); *H01L 23/5226* (2013.01); *H01L 23/5283* (2013.01);
(Continued)

(58) Field of Classification Search
None
See application file for complete search history.

(56) References Cited

U.S. PATENT DOCUMENTS 10,381,374 B2    8/2019  Tagami et al.
2018/0261623 A1  9/2018  Higashi et al.
(Continued)

FOREIGN PATENT DOCUMENTS

CN    110945652 A    3/2020
CN    111033739 A    4/2020
(Continued)

*Primary Examiner* — Sue A Purvis
*Assistant Examiner* — Carnell Hunter, III
(74) *Attorney, Agent, or Firm* — Muir Patent Law, PLLC

(57) ABSTRACT

A semiconductor device and a data storage system including the same, the semiconductor device including: a first structure including a peripheral circuit; and a second structure, including: a pattern structure; an upper insulating layer; a stack structure between the first structure and the pattern structure and including first and second stack portions spaced apart from each other, the first and second stack portions respectively including horizontal conductive layers and interlayer insulating layers alternately stacked; separation structures penetrating through the stack structure; memory vertical structures penetrating through the first stack portion; and a contact structure penetrating through the second stack portion, the pattern structure, and the upper insulating layer, wherein the contact structure includes a lower contact plug penetrating through at least the second stack portion and an upper contact plug contacting the lower contact plug and extending upwardly to penetrate through the pattern structure and the upper insulating layer.

20 Claims, 30 Drawing Sheets

(51) Int. Cl.
  *H01L 23/528* (2006.01)
  *H10B 41/10* (2023.01)
  *H10B 41/27* (2023.01)
  *H10B 41/35* (2023.01)
  *H10B 41/40* (2023.01)
  *H10B 43/10* (2023.01)
  *H10B 43/35* (2023.01)
  *H10B 43/40* (2023.01)

(52) U.S. Cl.
  CPC ............. *H10B 41/10* (2023.02); *H10B 41/27* (2023.02); *H10B 41/40* (2023.02); *H10B 43/10* (2023.02); *H10B 43/27* (2023.02); *H10B 43/35* (2023.02); *H10B 43/40* (2023.02)

(56) References Cited

U.S. PATENT DOCUMENTS

| | | | |
|---|---|---|---|
| 2019/0043868 A1 | 2/2019 | Hasnat et al. | |
| 2020/0098776 A1* | 3/2020 | Sugisaki | H10B 43/40 |
| 2020/0279841 A1 | 9/2020 | Sanuki et al. | |
| 2020/0411541 A1* | 12/2020 | Oh | H10B 43/27 |

FOREIGN PATENT DOCUMENTS

| | | | |
|---|---|---|---|
| CN | 111211133 A | 5/2020 | |
| CN | 111223871 A | 6/2020 | |
| CN | 110494979 B | 1/2021 | |

\* cited by examiner

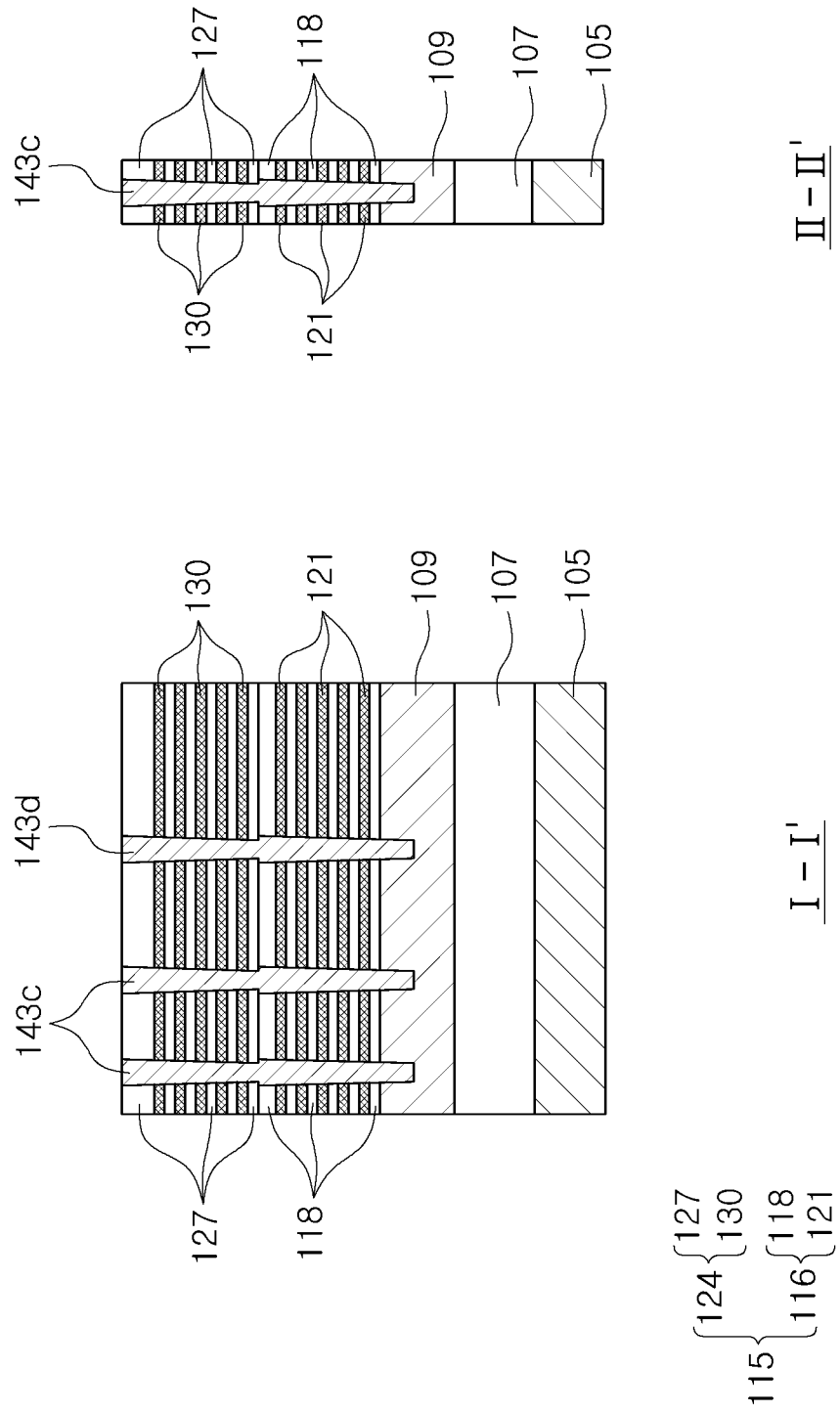

IVa-IVa'

IVa-IVa'

IVa-IVa'

SEMICONDUCTOR DEVICE AND DATA STORAGE SYSTEM INCLUDING THE SAME

CROSS-REFERENCE TO RELATED APPLICATION(S)

This application claims the benefit under 35 USC 119(a) of Korean Patent Application No. 10-2020-0151779 filed on Nov. 13, 2020, in the Korean Intellectual Property Office, the entire contents of which are incorporated herein by reference for all purposes.

BACKGROUND

1. Field

The present inventive concept relates to a semiconductor device and a data storage system including the same.

2. Description of Related Art

An electronic system required to store data may require a semiconductor device capable of storing high-capacity data. Accordingly, research is being conducted on a method of increasing the data storage capacity of the semiconductor device. For example, as one of the methods of increasing the data storage capacity of the semiconductor device, a semiconductor device including memory cells arranged in three dimensions instead of memory cells arranged in two dimensions has been proposed.

SUMMARY

Example embodiments provide a semiconductor device having improved integration and reliability.

Example embodiments provide a data storage system including the semiconductor device.

According to example embodiments, a semiconductor device includes: a first structure including a peripheral circuit; and a second structure disposed on the first structure and bonded to the first structure, wherein the second structure includes: a pattern structure; an upper insulating layer disposed on the pattern structure; a stack structure disposed between the first structure and the pattern structure and including a first stack portion and a second stack portion spaced apart from each other in a horizontal direction, the first and second stack portions respectively including horizontal conductive layers and interlayer insulating layers alternately stacked in a vertical direction; separation structures penetrating through the stack structure and separating the stack structure; memory vertical structures penetrating through the first stack portion of the stack structure; and a contact structure penetrating through the second stack portion, the pattern structure, and the upper insulating layer. The contact structure includes a lower contact plug penetrating through at least the second stack portion of the stack structure and an upper contact plug in contact with the lower contact plug and extending upwardly to penetrate through the pattern structure and the upper insulating layer.

According to example embodiments, a semiconductor device includes: a first structure including a peripheral circuit; and a second structure disposed on the first structure and bonded to the first structure, wherein the second structure includes: a pattern structure; an upper insulating layer disposed on the pattern structure; word lines disposed between the pattern structure and the first structure, and stacked r in a vertical direction; dummy horizontal conductive layers disposed between the pattern structure and the first structure, and stacked in the vertical direction; memory vertical structures penetrating through the word lines in the vertical direction and in contact with the pattern structure; separation structures penetrating through the word lines in the vertical direction and in contact with the pattern structure; and a contact structure penetrating through the dummy horizontal conductive layers, the pattern structure, and the upper insulating layer in the vertical direction. The dummy horizontal conductive layers are electrically isolated.

According to example embodiments, a data storage system includes a semiconductor device including a first structure including a peripheral circuit and a second structure disposed on the first structure and including a data storage layer storing data; and a controller electrically connected to the semiconductor device, wherein the second structure includes: a pattern structure; an upper insulating layer disposed on the pattern structure; word lines disposed between the pattern structure and the first structure, and stacked in a vertical direction; dummy horizontal conductive layers disposed between the pattern structure and the first structure, and stacked in the vertical direction; memory vertical structures penetrating through the word lines in the vertical direction and in contact with the pattern structure; separation structures penetrating through the word lines in the vertical direction and in contact with the pattern structure; and a contact structure penetrating through the dummy horizontal conductive layers, the pattern structure, and the upper insulating layer in the vertical direction, and wherein the dummy horizontal conductive layers are electrically isolated.

BRIEF DESCRIPTION OF DRAWINGS

The above and other aspects, features, and advantages of the present inventive concept will be more clearly understood from the following detailed description, taken in conjunction with the accompanying drawings, in which like numerals refer to like elements. In the drawings:

FIGS. 11, 12A to 12C, 13A to 13C, and 14A to 14C are cross-sectional views each illustrating an example of a method of manufacturing the semiconductor device, according to an example embodiment;

DETAILED DESCRIPTION

Figure 1:
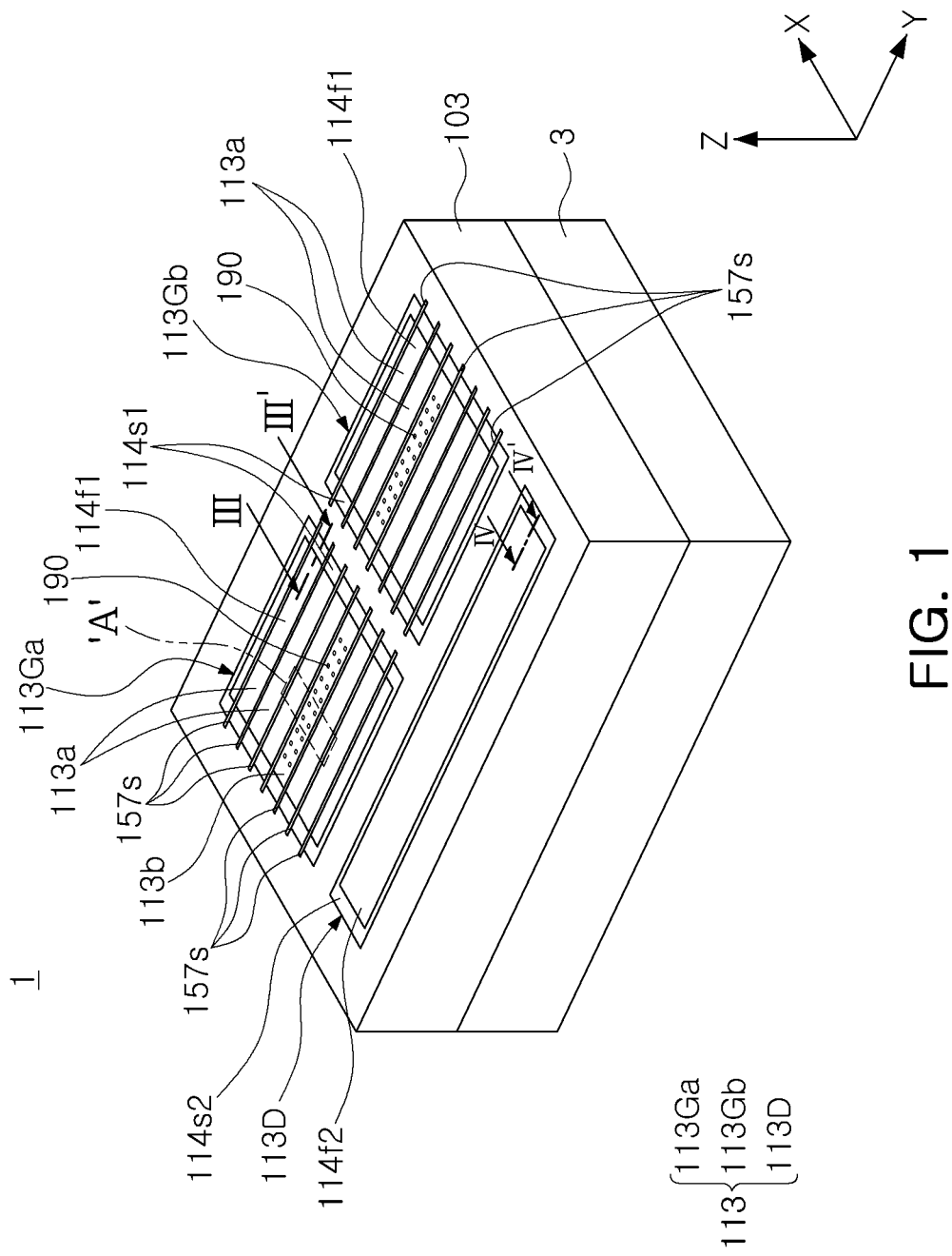
FIGS. 1, 2, and 3A to 3D are schematic views each illustrating an example of a semiconductor device, according to an example embodiment.

Hereinafter, example embodiments will be described with reference to the accompanying drawings.

Hereinafter, terms such as 'upper', 'upper portion', 'upper surface', 'lower', 'lower portion', 'lower surface' and 'side surface' are indicated by reference numerals and may be understood as referring to drawings, unless otherwise indicated.

Figure 2:
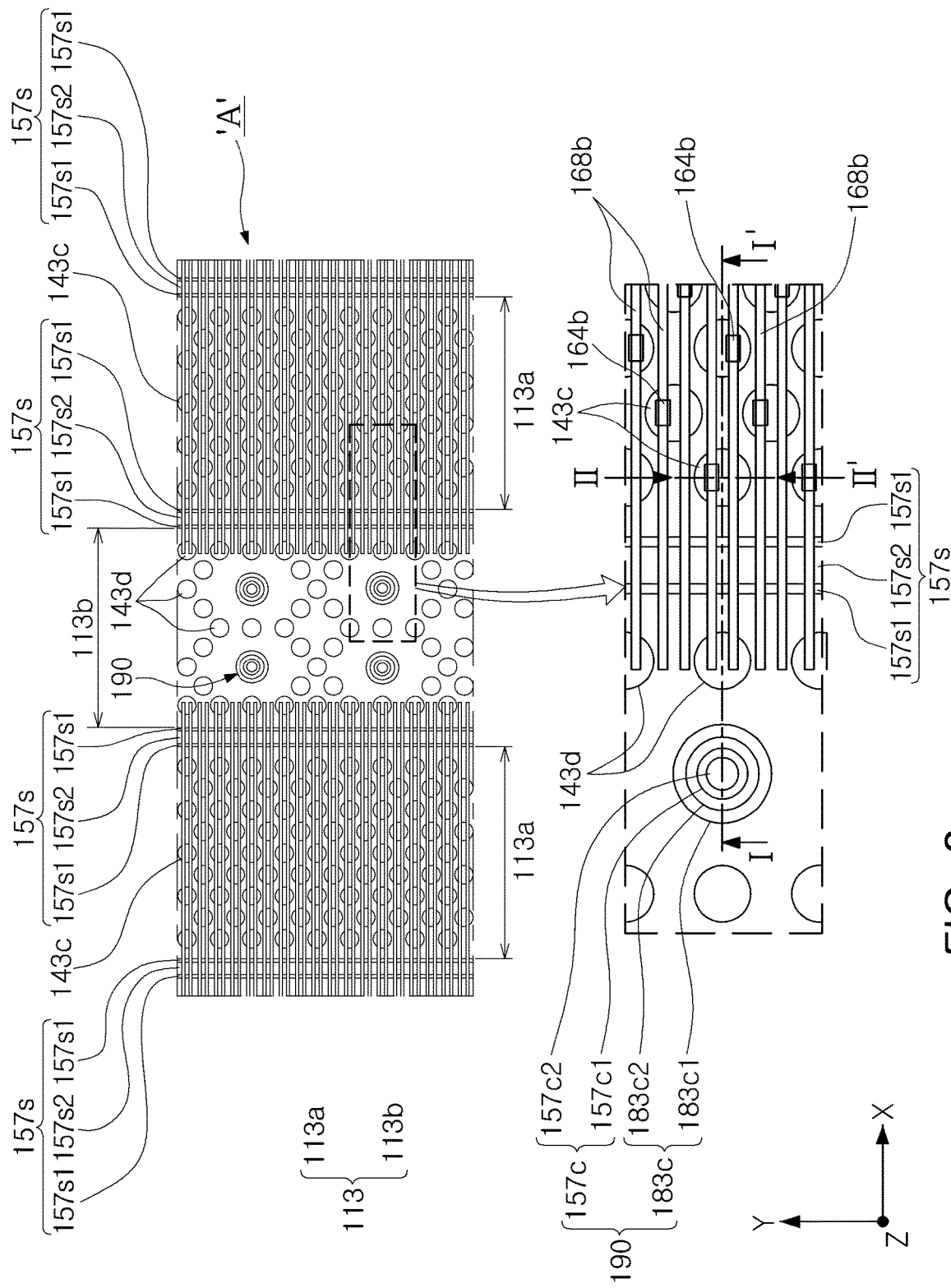
Figure 3A:
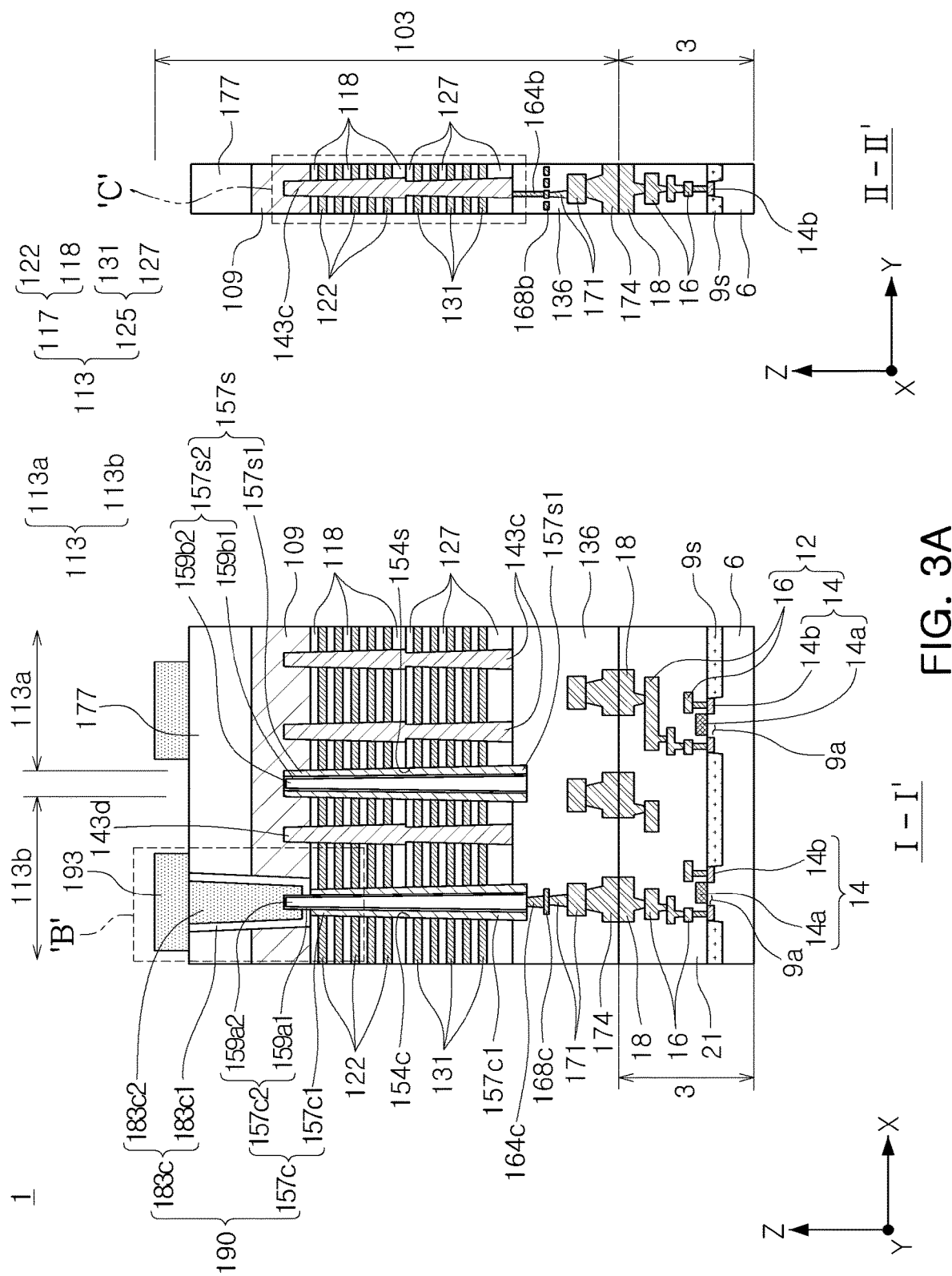
Figure 3B:
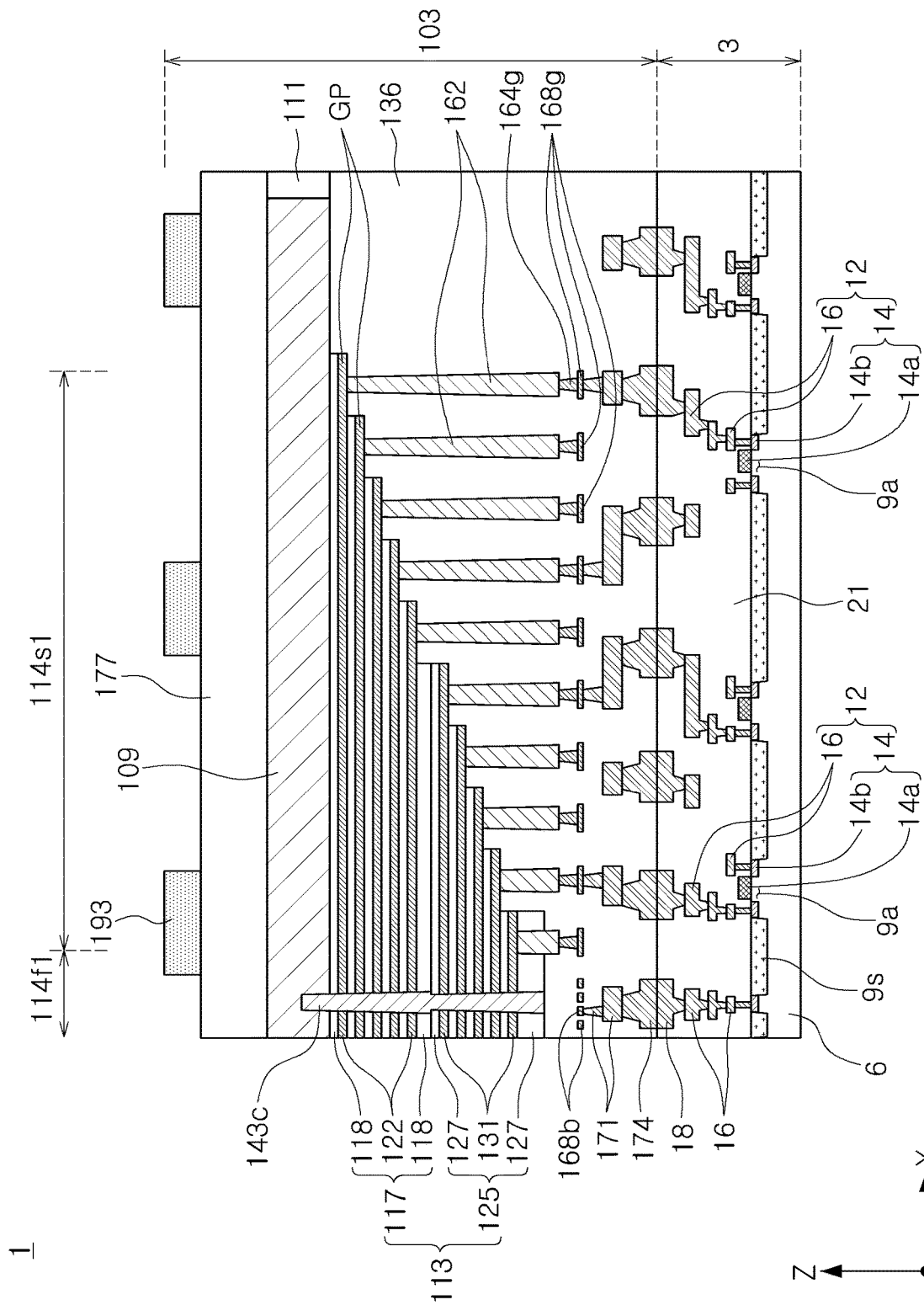
Figure 3C:
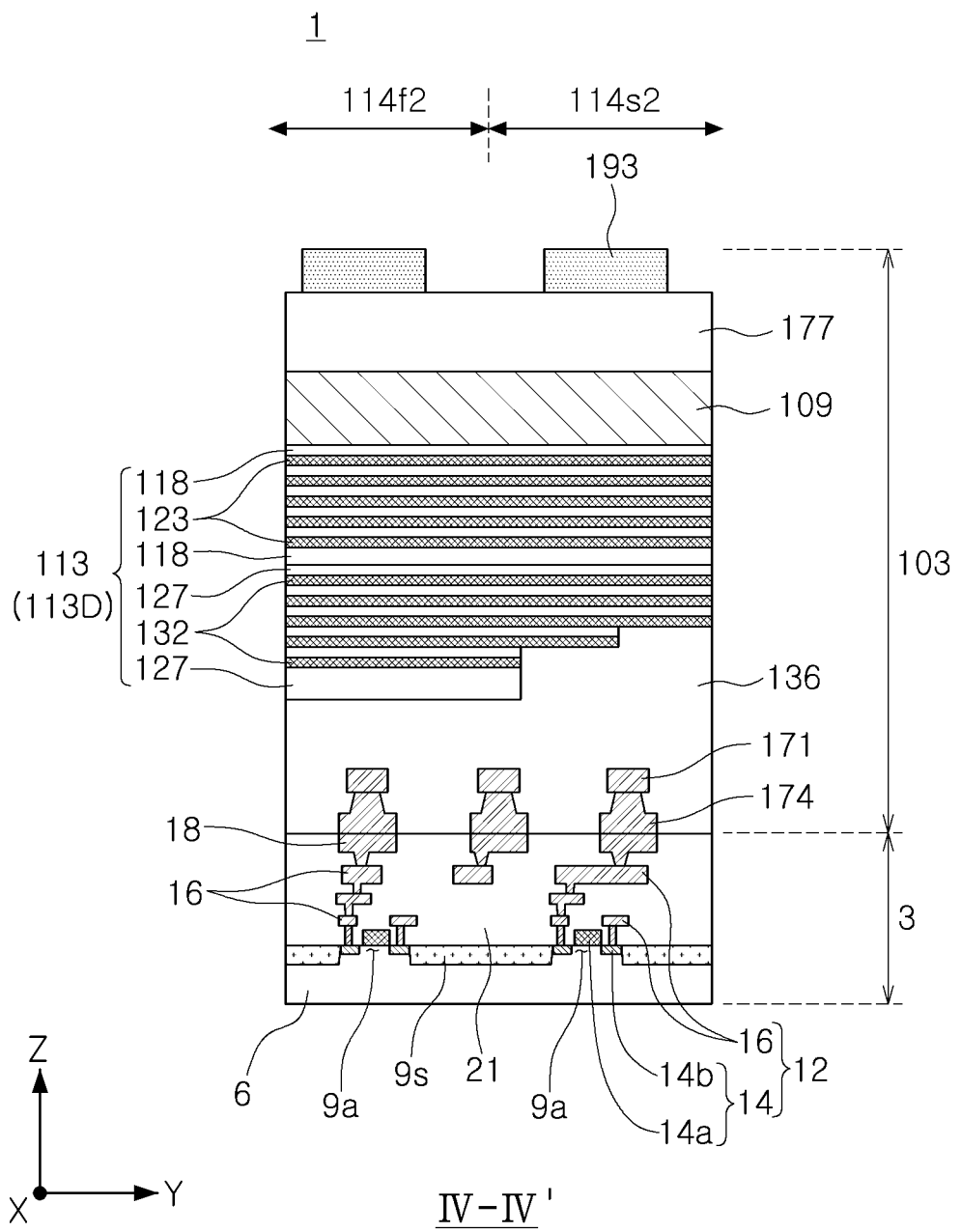
Figure 3D:
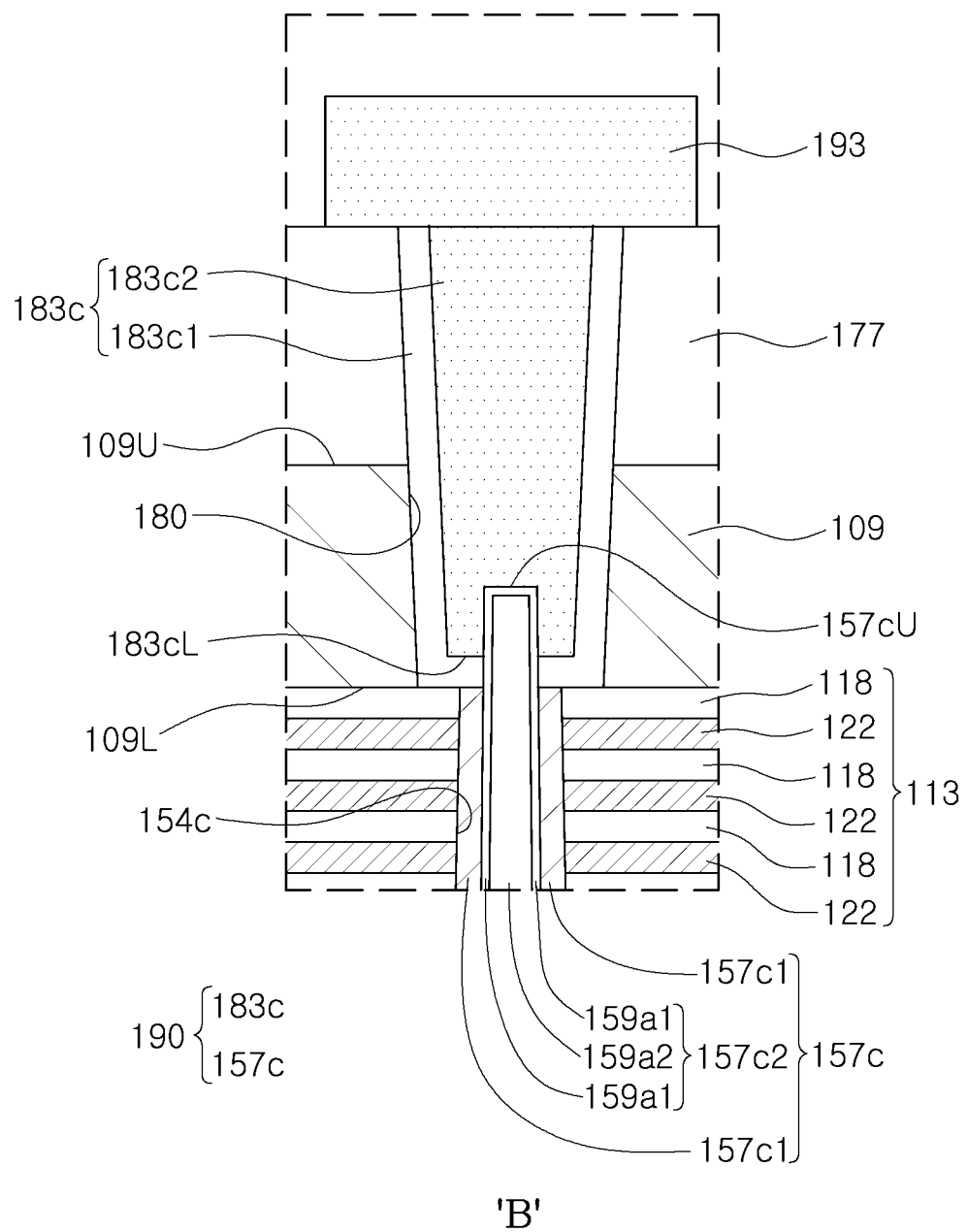

FIG. 1 is a schematic perspective view illustrating a semiconductor device according to an example embodiment; FIG. 2 is an enlarged plan view illustrating a region indicated by "A" in FIG. 1; FIG. 3A is a cross-sectional view illustrating a region taken along lines I-I' and II-II' of FIG. 2; FIG. 3B is a cross-sectional view illustrating a region taken along line III-III' of FIG. 1; FIG. 3C is a cross-sectional view illustrating a region taken along line IV-IV' of FIG. 1; and FIG. 3D is an enlarged cross-sectional view illustrating a portion indicated by "B" in FIG. 3A.

Referring to FIGS. 1, 2, and 3A to 3D, a semiconductor device 1 according to an example embodiment may include a first structure 3 and a second structure 103 disposed on the first structure 3. In some embodiments, the first structure 3 may be disposed on and bonded to the second structure 103.

The first structure 3 may be a first semiconductor chip including a peripheral circuit, and the second structure 103 may be a second semiconductor chip including a memory cell array region in which memory cells capable of storing data are arranged in three dimensions.

In an example embodiment, the first structure 3 may include: a semiconductor substrate 6; an isolation region 9s disposed on the semiconductor substrate 6 and defining a peripheral active region 9a; a peripheral circuit 12 formed on the semiconductor substrate 6; first bonding pads 18 electrically connected to the peripheral circuit 12; and a first insulating structure 21 disposed on the semiconductor substrate 6, covering the peripheral circuit 12 and having an upper surface coplanar with upper surfaces of the first bonding pads 18. Terms such as "same," "equal," "planar," or "coplanar," as used herein, encompass near identicality including variations that may occur, for example, due to manufacturing processes. The term "substantially" may be used herein to emphasize this meaning, unless the context or other statements indicate otherwise.

The peripheral circuit 12 may include a circuit device 14 such as a transistor including a peripheral gate 14a and a peripheral source/drain 14b, and a circuit interconnection 16 electrically connected to the circuit device 14. The circuit device 14 may further include a circuit element such as a resistor and a capacitor in addition to an active element such as the transistor.

The circuit interconnection 16 may be electrically connected to the first bonding pads 18. Therefore, the circuit interconnection 16 may electrically connect the first bonding pads 18 and the peripheral circuit 12 to each other.

In an example embodiment, the first bonding pads 18 may include a metal, for example, copper.

In an example embodiment, the second structure 103 may include a pattern structure 109, a stack structure 113, separation structures 157s, memory vertical structures 143c, a contact structure 190, second insulating structures 136, 111, and 177, and second bonding pads 174.

The pattern structure 109 may include a doped silicon layer. For example, the pattern structure 109 may include a polysilicon layer having an N-type conductivity.

The stack structure 113 may be disposed between the pattern structure 109 and the first structure 3.

In an example embodiment, the stack structure 113 may include a plurality of stacked groups 113Ga, 113Gb, and 113D. For example, the plurality of stacked groups 113Ga, 113Gb, and 113D of the stack structure 113 may include the first stacked group 113Ga and the second stacked group 113Gb and the dummy stacked group 113D, which are spaced apart from one another in a horizontal direction. For example, the first stacked group 113Ga and the second stacked group 113Gb may be spaced apart from each other in a first horizontal direction X. The dummy stacked group 113D may be spaced apart from the first stacked group 113Ga and the second stacked group 113Gb in a second horizontal direction Y perpendicular to the first horizontal direction X. However, the numbers and arrangement positions of the first stacked group 113Ga, the second stacked group 113Gb and the dummy stacked group 113D are not limited to the shape illustrated in FIG. 1 and may be variously modified.

In an example embodiment, each of the first and second stacked groups (e.g., first and second stacked groups 113Ga and 113Gb in FIG. 1) may include a first flat region 114f1 and a first stepped region 114s1 disposed on at least one side of the first flat region 114f1. The first stepped region 114s1 may surround the first flat region 114f1.

In an example embodiment, the dummy stacked group (e.g., the dummy stacked group 113D in FIG. 1) may include a second flat region 114f2 and a second stepped region 114s2 disposed on at least one side of the second flat region 114f2. The second stepped region 114s2 may surround the second flat region 114f2.

In an example embodiment, each of the first stacked group 113Ga and the second stacked group 113Gb may include a plurality of first stack portions 113a.

In an example embodiment, at least one of the first stacked group 113Ga and the second stacked group 113Gb may include one or more second stack portions 113b. Accordingly, the stack structure 113 may include the first stack portions 113a and the one or more the second stack portions 113b.

In an example embodiment, at least one of the second stack portions 113b may be disposed between the first stack portions 113a. For example, at least one of the first stacked group 113Ga and the second stacked group 113Gb may include the plurality of first stack portions 113a, and one second stack portion 113b may be disposed between two first stack portions 113a of the plurality of first stack portions 113a.

In an example embodiment, the separation structures 157s may be disposed in separation trenches 154s penetrating through the stack structure 113 and separating the stack structure 113 in the first horizontal direction X. Accordingly, the separation structures 157s may penetrate through the stack structure 113. For example, the separation structures 157s may penetrate through the first stacked group 113Ga of the stack structure 113 and may penetrate through the second stacked group 113Gb of the stack structure 113. Each of the separation structures 157s may have a shape of a line extending in the first horizontal direction X. The separation structures 157s may extend into the pattern structure 109 and may be in contact with the pattern structure 109. The term "contact," as used herein, refers to a direct connection (i.e., touching) unless the context indicates otherwise.

Some of the separation structures 157s may penetrate through the first stacked group 113Ga and divide the first stacked group 113Ga into the plurality of stack portions 113a and 113b spaced apart from each other in the second horizontal direction Y, and some of the separation structures 157s may penetrate through the second stacked group 113Gb and divide the second stacked group 113Gb into the plurality of stack portions 113a and 113b spaced apart from each other in the second horizontal direction Y.

At least one of the plurality of stack portions 113a and 113b spaced apart from each other in the second horizontal direction Y may be the second stack portion 113b, and the plurality of stack portions may be the first stack portions 113a.

In an example embodiment, each of the first and second stack portions 113a and 113b of the stack structure 113 may include interlayer insulating layers 118 and 127 and horizontal gate layers 122 and 131, which are alternately and repeatedly stacked in a vertical direction Z. Each of the horizontal gate layers 122 and 131 may include a conductive layer. The horizontal gate layers 122 and 131 may be stacked and spaced apart from each other in the vertical direction Z.

In an example embodiment, at least some of the horizontal gate layers 122 and 131 of the first stack portion 113a may be word lines. Among the horizontal gate layers 122 and 131 of the first stack portion 113a, one or more upper horizontal gate layers disposed at its upper portion and/or one or more lower horizontal gate layers disposed at its lower portion may be selection gate electrodes, and a plurality of horizontal gate layers disposed between the one or plurality of upper horizontal gate layers and the one or more lower horizontal gate layers may be the word lines.

In an example embodiment, the horizontal gate layers 122 and 131 of the second stack portion 113b may be dummy horizontal conductive layers which may be electrically isolated.

In an example embodiment, the dummy stacked group 113D of the stack structure 113 may include the interlayer insulating layers 118 and 127 and horizontal insulating layers 123 and 132 which are alternately and repeatedly stacked in the vertical direction.

In an example embodiment, each of the first and second stack portions 113a and 113b of the stack structure 113 may include a first stacked region 125 and a second stacked region 117 disposed on the first stacked region 125. Here, the first stacked region 125 may be disposed between the second stacked region 117 and the first structure 3.

The first stacked region 125 may include the first interlayer insulating layers 127 and the first horizontal gate layers 131 which are alternately and repeatedly stacked in the vertical direction Z. A lowermost layer and an uppermost layer among the first interlayer insulating layers 127 and the first horizontal gate layers 131 may each be one of the first interlayer insulating layers 127.

In an example embodiment, the second stacked region 117 may include the second interlayer insulating layers 118 and the second horizontal gate layers 122 which are alternately and repeatedly stacked in the vertical direction. A lowermost layer and an uppermost layer among the second interlayer insulating layers 118 and the second horizontal gate layers 122 may each be one of the second interlayer insulating layers 118.

The first and second horizontal gate layers 131 and 122 may have pad regions GP arranged in a step shape within the first stepped region 114s1. The pad regions GP of the first and second horizontal gate layers 131 and 122 may have a shape of the step down in a direction from the first structure 3 toward the pattern structure 109. The pad regions GP may face the first structure 3.

The second structure 103 may further include gate contact plugs 162 in contact with the pad regions GP and electrically connected to the first and second horizontal gate layer 131 and 122. For example, the gate contact plugs 162 may be electrically connected to the first and second horizontal gate layers 131 and 122, which may be the selection gate electrodes and the word lines, among the first and second horizontal gate layers 131 and 122. The gate contact plugs 162 may extend downward from a portion of the first and second horizontal gate layer 131 or 122 in contact with the pad regions GP. For example, the gate contact plugs 162 may extend from the pad regions GP toward the first structure 3. The gate contact plugs 162 may be formed of a conductive material.

The memory vertical structures 143c may penetrate through the first stack portion 113a of the stack structure 113. For example, the memory vertical structures 143c may penetrate through the horizontal gate layers 122 and 131, which may be the selection gate electrodes and word lines of the first stack portion 113a, in the vertical direction Z.

In an example embodiment, the memory vertical structures 143c may extend into the pattern structure 109 from its portion penetrating through the first stack portion 113a of the stack structure 113 to be in contact with the pattern structure 109.

The second structure 103 may further include dummy vertical structures 143d. The dummy vertical structures 143d may penetrate through the second stack portion 113b of the stack structure 113 and may be in contact with the pattern structure 109.

In an example embodiment, the dummy vertical structures 143d may include the same material layer as the memory vertical structures 143c. For example, the dummy vertical structures 143d may be formed by substantially the same process as the memory vertical structures 143c, and may have a cross-sectional structure substantially the same as the memory vertical structures 143c.

In another example embodiment, the dummy vertical structures 143d may be formed by a process different from the memory vertical structures 143c. For example, each of the dummy vertical structures 143d may be formed of a silicon oxide column.

The second bonding pads 174 may be in contact with and bonded to the first bonding pads 18. The first and second bonding pads 18 and 174 may include the same conductive material, for example, copper.

In an example embodiment, the second insulating structures 136, 111, and 177 may include an outer insulating layer 111 disposed on a side surface of the pattern structure 109, and an upper insulating layer 177 disposed on the pattern structure 109 and the outer insulating layer 111. The outer insulating layer 111 may contact the side surface of the pattern structure 109, and the upper insulating layer 177 may contact upper surfaces of the pattern structure 109 and the outer insulating layer 111. The second insulating structures 136, 111, and 177 may further include a capping insulating layer 136 disposed on the first structure 3 and covering the stack structure 113 while surrounding side surfaces of the second bonding pads 174. The pattern structure 109 and the outer insulating layer 111 may contact an upper surface of the capping insulating layer 136. The upper insulating layer 177 may be formed of a silicon oxide layer. The capping insulating layer 136 may include a single material layer or multiple material layers. For example, the capping insulating layer 136 may be formed of a silicon oxide layer or may be formed to include a silicon oxide layer and a material having etching selectivity with the silicon oxide layer, for example, a silicon nitride layer.

The capping insulating layer 136 may fill a space between the stack structure 113 and the first structure 3 while surrounding each of the first stacked group 113Ga, the second stacked group 113Gb and the dummy stacked group 113D. For example, a portion of the capping insulating layer 136 may fill the space between the first stacked group 113Ga, the second stacked group 113Gb and the dummy stacked group 113D, which are spaced apart from one another.

A plurality of contact structures 190 may be arranged. At least some of the plurality of contact structures 190 may penetrate through the stack structure 113, the pattern structure 109, and the upper insulating layer 177. Each of the plurality of contact structures 190 may include a lower contact structure 157c and an upper contact structure 183c disposed on the lower contact structure 157c.

In the following, for easier understanding, the description is made focusing on one contact structure 190 including a portion penetrating through the stack structure 113.

The lower contact structure 157c of the contact structure 190 may be disposed in a lower contact hole 154c passing through the second stack portion 113b of the stack structure 113, and the upper contact structure 183c thereof may be disposed in an upper contact hole 180 passing through the pattern structure 109 and the upper insulating layer 177.

In an example embodiment, the upper contact structure 183c adjacent to the lower contact structure 157c may have a greater width than the lower contact structure 157c adjacent to the upper contact structure 183c.

The lower contact structure 157c may include a conductive lower contact plug 157c2 and an insulating lower spacer 157c1 surrounding a side surface of the lower contact plug 157c2.

In an example embodiment, the lower contact plug 157c2 of the lower contact structure 157c may include a portion penetrating through the second stack portion 113b of the stack structure 113 and a portion extending into the pattern structure 109 from the portion penetrating through the second stack portion 113b of the stack structure 113. Accordingly, an upper surface (e.g., the upper surface 157cU in FIG. 3D) of the lower contact plug 157c2 may be disposed at a height level between a lower surface (e.g., the lower surface 109L in FIG. 3) of the pattern structure 109 and an upper surface (e.g., the upper surface 109U in FIG. 3D) of the pattern structure 109. For example, the upper surface 157cU of the lower contact plug 157c2 may be disposed at a level higher than the lower surface 109L of the pattern structure 109, and may be disposed at a level lower than the upper surface 109U of the pattern structure 109. In an example embodiment, a height difference between the upper surface 157cU of the lower contact plug 157c2 and the lower surface 109L of the pattern structure 109 may be smaller than a height difference between the upper surface 157cU of the lower contact plug 157c2 and the upper surface 109U of the pattern structure 109.

The lower contact plug 157c2 may include a first liner layer 159a1 and a first pillar pattern 159a2.

In an example embodiment, the first liner layer 159a1 may cover at least a side surface of the first pillar pattern 159a2. For example, the first liner layer 159a1 may contact at least the side surface of the first pillar pattern 159a2.

In an example embodiment, the first liner layer 159a1 may include a portion covering the side surface of the first pillar pattern 159a2 and a portion covering an upper surface of the first pillar pattern 159a2. For example, the first liner layer 159a1 may include a portion contacting the side surface of the first pillar pattern 159a2 and a portion contacting an upper surface of the first pillar pattern 159a2. Here, the "upper surface" of the first pillar pattern 159a2 may be a term referred to with reference to FIG. 3A.

The upper contact structure 183c may include an upper contact plug 183c2 in contact with the lower contact plug 157c2 and an insulating upper spacer 183c1 surrounding at least a side surface of the upper contact plug 183c2. The insulating upper spacer 183c1 may contact at least the side surface of the upper contact plug 183c2.

The upper contact plug 183c2 may be in contact with the upper surface 157cU of the lower contact plug 157c2 and may be in contact with the side surface of the lower contact plug 157c2, which is adjacent to the upper surface 157cU of the lower contact plug 157c2.

The upper spacer 183c1 may be formed of an insulating material such as silicon oxide and/or silicon nitride. The upper contact plug 183c2 may include at least one of a conductive material, for example, a metal nitride (e.g., titanium nitride (TiN), tantalum nitride (TaN), or tungsten nitride (WN)) or a metal (e.g., tungsten (W), copper (Cu), or aluminum (Al)).

In an example embodiment, a thickness of the upper spacer 183c1 in the horizontal direction may be greater than a thickness of the lower spacer 157c1 in the horizontal direction.

In an example embodiment, a lower surface 183cL of the upper contact plug 183c2 may be disposed at a level higher than the lower surface 109L of the pattern structure 109, and at a level lower than the upper surface 109U of the pattern structure 109.

Each of the separation structures 157s may include an insulating separation spacer 157s1 and a conductive separation pattern 157s2. The separation pattern 157s2 may include a second liner layer 159b1 and a second pillar pattern 159b2. The second liner layer 159b1 may cover an upper surface of the second pillar pattern 159b2 while covering a side surface of the second pillar pattern 159b2. For example, the second liner layer 159b1 may contact the upper and side surfaces of the second pillar pattern 159b2. Here, the upper surface of the second pillar pattern 159b2 may be disposed at a height level between the lower surface 109L of the pattern structure 109 and the upper surface 109U of the pattern structure 109.

In an example embodiment, the separation spacer 157s1 of the separation structures 157s and the lower spacer 157c1 of the lower contact structure 157c may be formed of the same material, for example, silicon oxide and/or silicon nitride, formed by the same process.

In an example embodiment, the separation pattern 157s2 of the separation structures 157s and the lower contact plug 157c2 of the lower contact structure 157c may be formed of the same conductive material and formed by the same process. For example, the first liner layer 159a1 of the lower contact plug 157c2 and the second liner layer 159b1 of the separation pattern 157s2 may include the same conductive material, for example, metal nitride (e.g., TiN, TaN, or WN), and be formed by the same process, and the first pillar pattern 159a2 of the lower contact plug 157c2 and the second pillar pattern 159b2 of the separation pattern 157s2 may include the same conductive material, for example, metal (e.g., W), and be formed by the same process. For another example, the lower contact plug 157c2 and the separation pattern 157s2 may include at least one of doped silicon, a metal-semiconductor compound, a metal nitride, and a metal.

The second structure 103 disposed between the stack structure 113 and the first structure 3 may further include bit lines 168b, gate interconnections 168g, a contact interconnection 168c, bit line connection vias 164b, gate connection vias 164g, and a contact connection via 164c. The gate interconnections 168g and the contact interconnection 168c may each be referred to as the gate interconnection lines 168g and the contact interconnection lines 168c. The bit line connection vias 164b may be disposed between the bit lines 168b and the memory vertical structures 143c, and may electrically connect the bit lines 168b and the memory vertical structures 143c to each other. The bit lines 168b may not be electrically connected to the dummy vertical structures 143d. The gate connection vias 164g may be disposed between the gate interconnections 168g and the gate contact plugs 162, and may electrically connect the gate interconnections 168g and the gate contact plugs 162 to each other. The contact connection via 164c may be disposed between the contact interconnection 168c and the lower contact plug 157c2, and may electrically connect the contact interconnection 168c and the lower contact plug 157c2 to each other. The second structure 103 may further include an interconnection structure 171 electrically connecting the bit lines 168b, the gate interconnections 168g and the contact interconnection 168c with the second bonding pads 174. The second structure 103 may further include a conductive pattern 193 disposed on the upper insulating layer 177 and electrically connected to the upper contact plug 183c2.

In an example embodiment, the contact structure 190 may be an input/output contact structure for transmitting an input/output signal of the semiconductor device 1.

Next, various modified examples of the contact structure 190 are respectively described with reference to FIGS. 4A to 4D. Each of FIGS. 4A to 4D is a partially enlarged cross-sectional view corresponding to the partially enlarged cross-sectional view of FIG. 3D, and may indicate a modified example of the portion of the contact structure 190, which is illustrated in FIG. 3D. Hereinafter, the description is made focusing on a portion of the contact structure 190, which may be modified, with reference to FIGS. 4A to 4D, respectively.

Figure 4A:
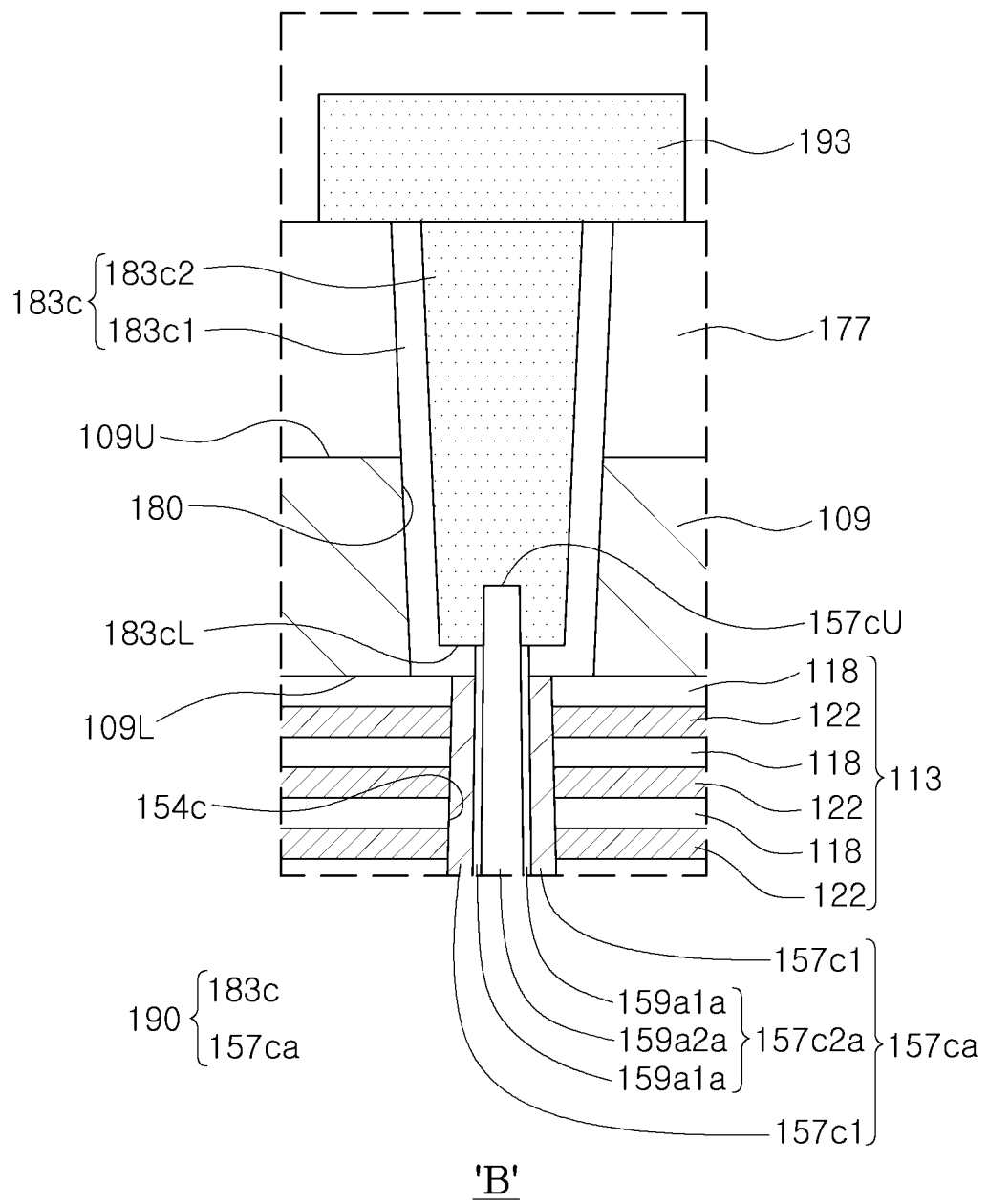
FIG. 4A is a partially enlarged cross-sectional view illustrating a modified example of the semiconductor device, according to an example embodiment.

Referring to FIG. 4A, the modified example may provide a lower contact structure 157ca including a lower contact plug 157c2a and the lower spacer 157c1, and the lower contact plug 157c2a may include a first pillar pattern 159a2a and a first liner layer 159a1a surrounding a portion of a side surface of the first pillar pattern 159a2a. The first pillar pattern 159a2a may extend into the upper contact plug 183c2 and may be in contact with the upper contact plug 183c2. The upper contact plug 183c2 may be in contact with the upper surface 157cU of the first pillar pattern 159a2a, and may be in contact with a side surface of a portion of the first pillar pattern 159a2a, which extends into the upper contact plug 183c2.

Figure 4B:
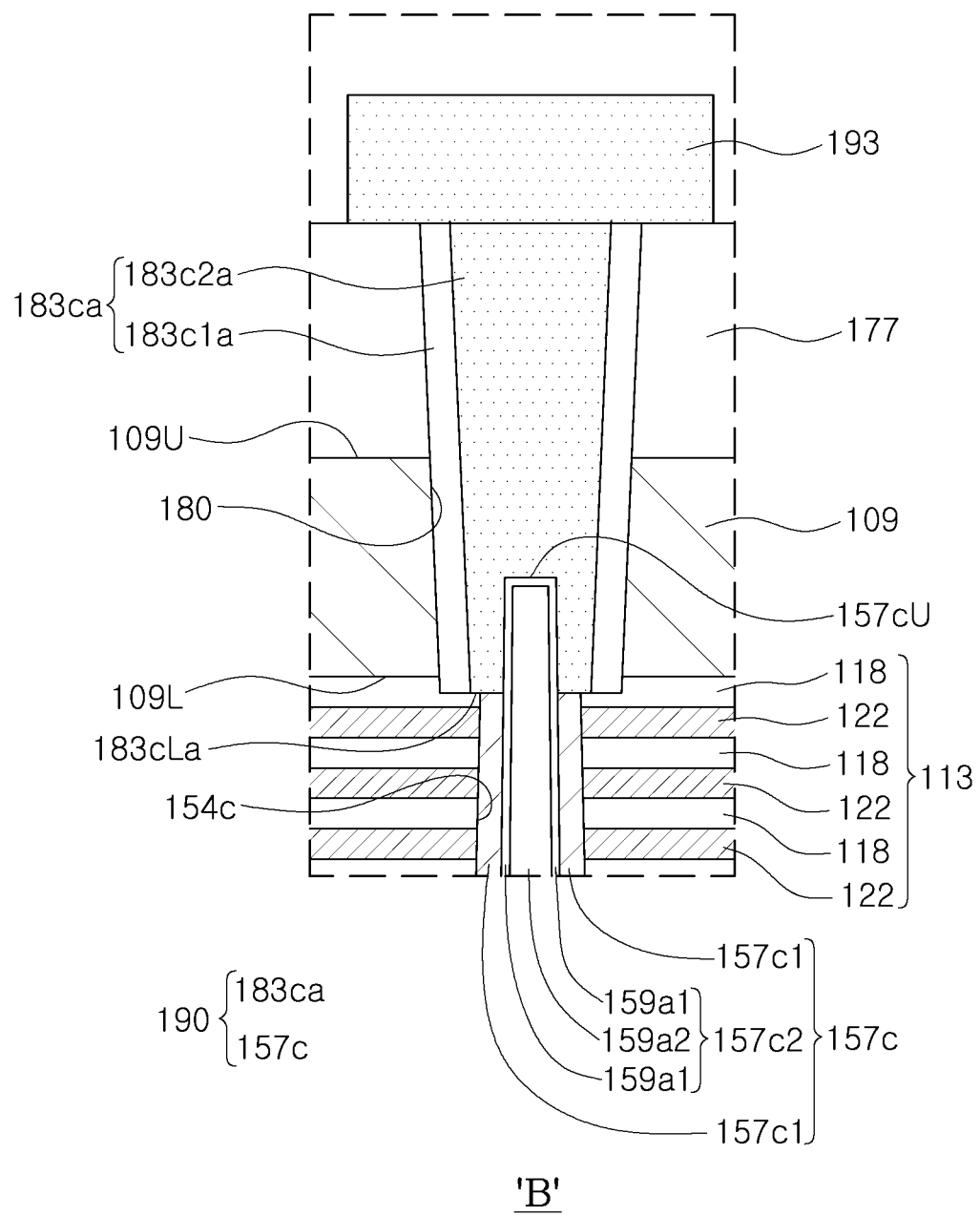
FIG. 4B is a partially enlarged cross-sectional view illustrating a modified example of the semiconductor device, according to an example embodiment.

Referring to FIG. 4B, another modified example may provide the upper contact structure 183ca including an upper contact plug 183c2a and an upper spacer 183c1a, and the upper spacer 183c1a may surround a side surface of the upper contact plug 183c2a.

In an example embodiment, a lower surface 183cLa of the upper contact plug 183c2a may be disposed at substantially the same level as the lower surface 109L of the pattern structure 109 or at a level lower than the lower surface 109L of the pattern structure 109.

Figure 4C:
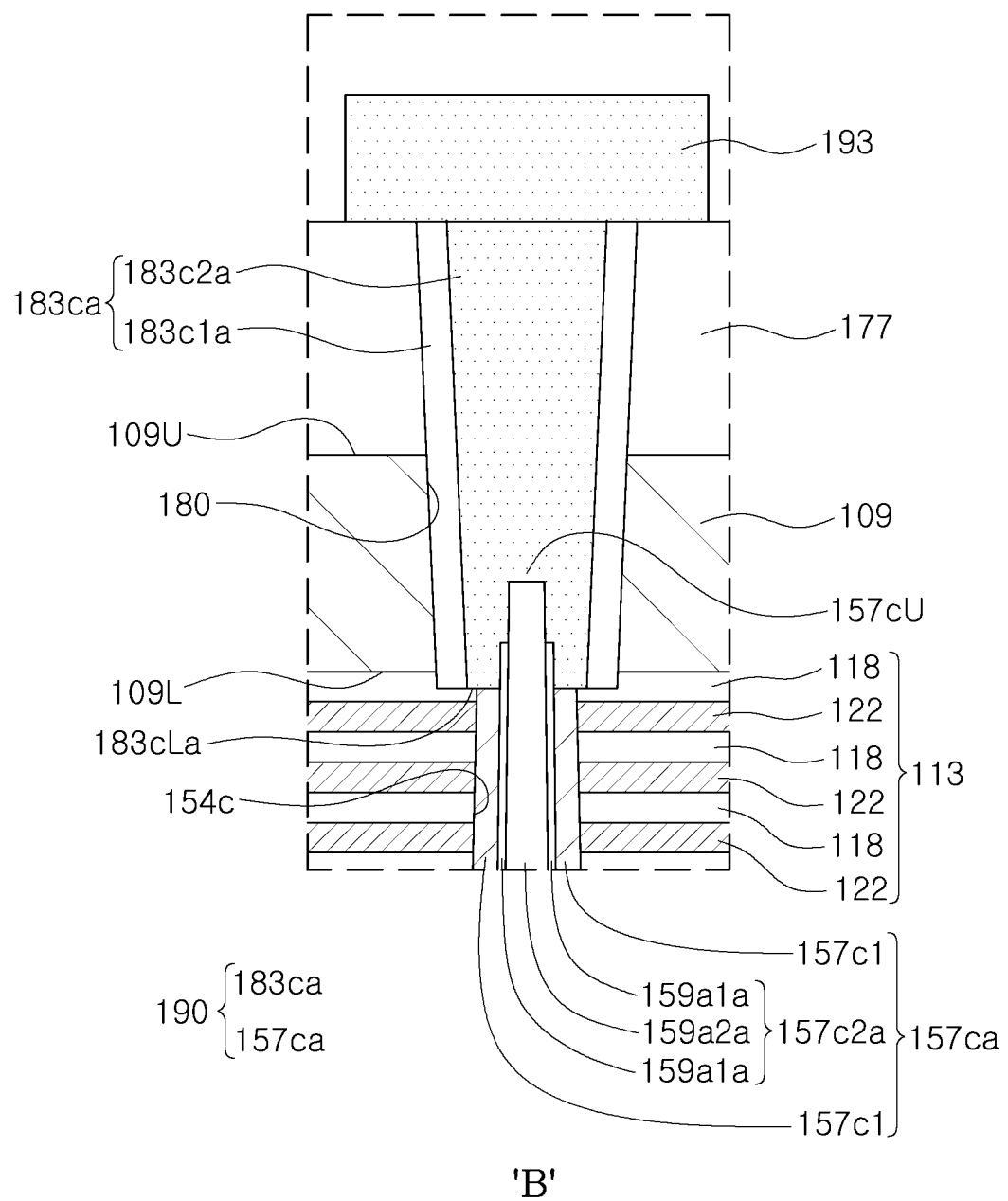
FIG. 4C is a partially enlarged cross-sectional view illustrating a modified example of the semiconductor device, according to an example embodiment.

Referring to FIG. 4C, another modified example may provide the lower contact structure 157ca substantially the same as that illustrated in FIG. 4A and the upper contact structure 183ca substantially the same as that described with reference to FIG. 4B. For example, the upper surface and a portion of the side surface of the first pillar pattern 159a2a of the lower contact structure 157ca described with reference to FIG. 4A may be in contact with the upper contact plug 183c2a. A portion of the first liner layer 159a1a of the lower contact structure 157ca described with reference to FIG. 4A may be interposed between the side surface of the first pillar pattern 159a2a and the upper contact plug 183c2a.

Figure 4D:
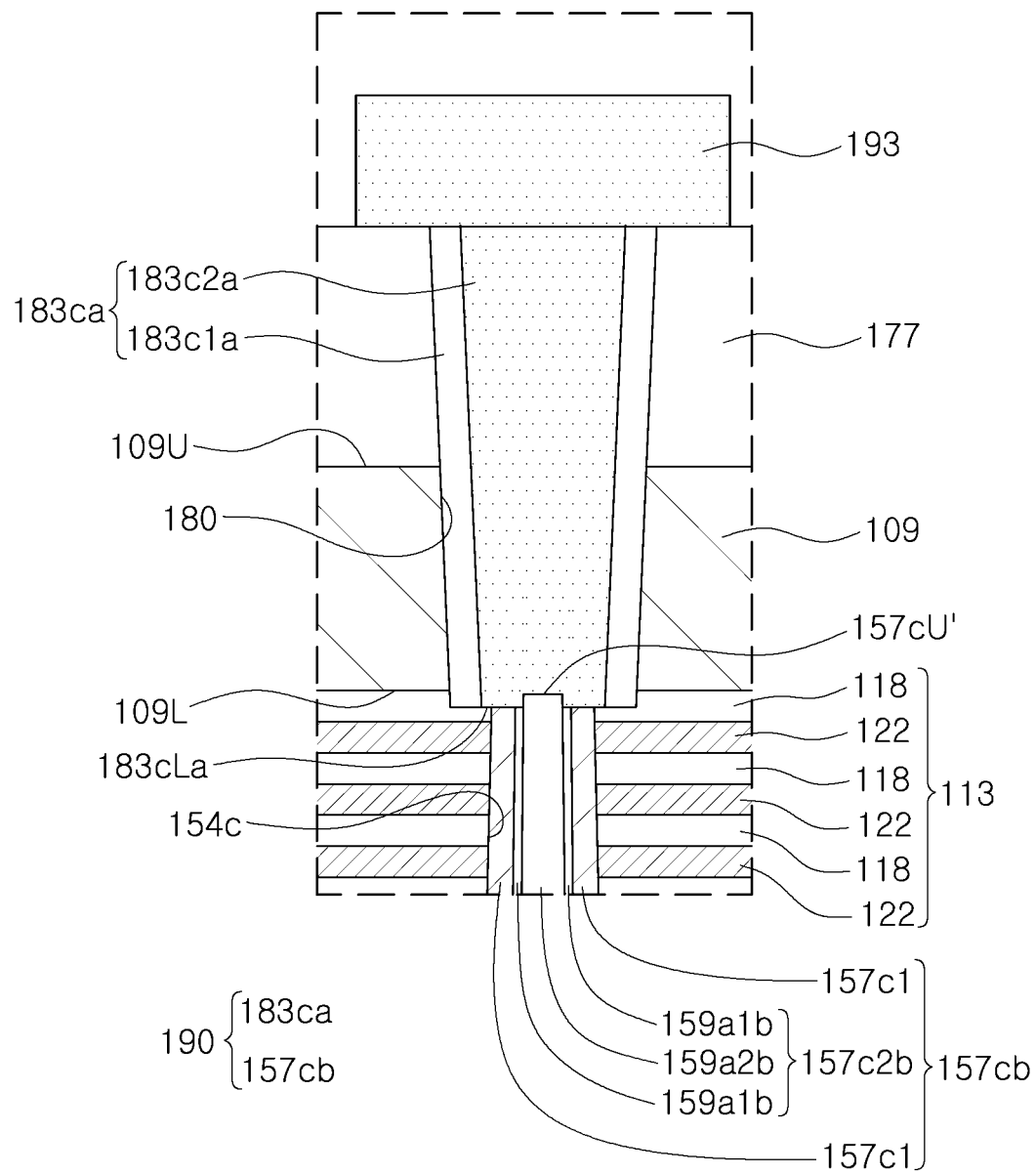
FIG. 4D is a partially enlarged cross-sectional view illustrating a modified example of the semiconductor device, according to an example embodiment.

Referring to FIG. 4D, another modified example may provide the upper contact structure 183ca substantially the same as that described with reference to FIG. 4B.

A lower contact structure 157cb may include a lower contact plug 157c2b and the lower spacer 157c1, and the lower contact plug 157c2b may include a first pillar pattern 159a2b and a first liner layer 159a1b surrounding at least a portion of a side surface of the first pillar pattern 159a2b.

In an example embodiment, the first pillar pattern 159a2b may extend into the upper contact plug 183c2 and may be in contact with the upper contact plug 183c2.

In an example embodiment, an upper surface 157cU' of the lower contact plug 157c2b may be disposed at the same height level as the lower surface 109L of the pattern structure 109, or at a height level lower than the lower surface 109L of the pattern structure 109.

Figure 5A:
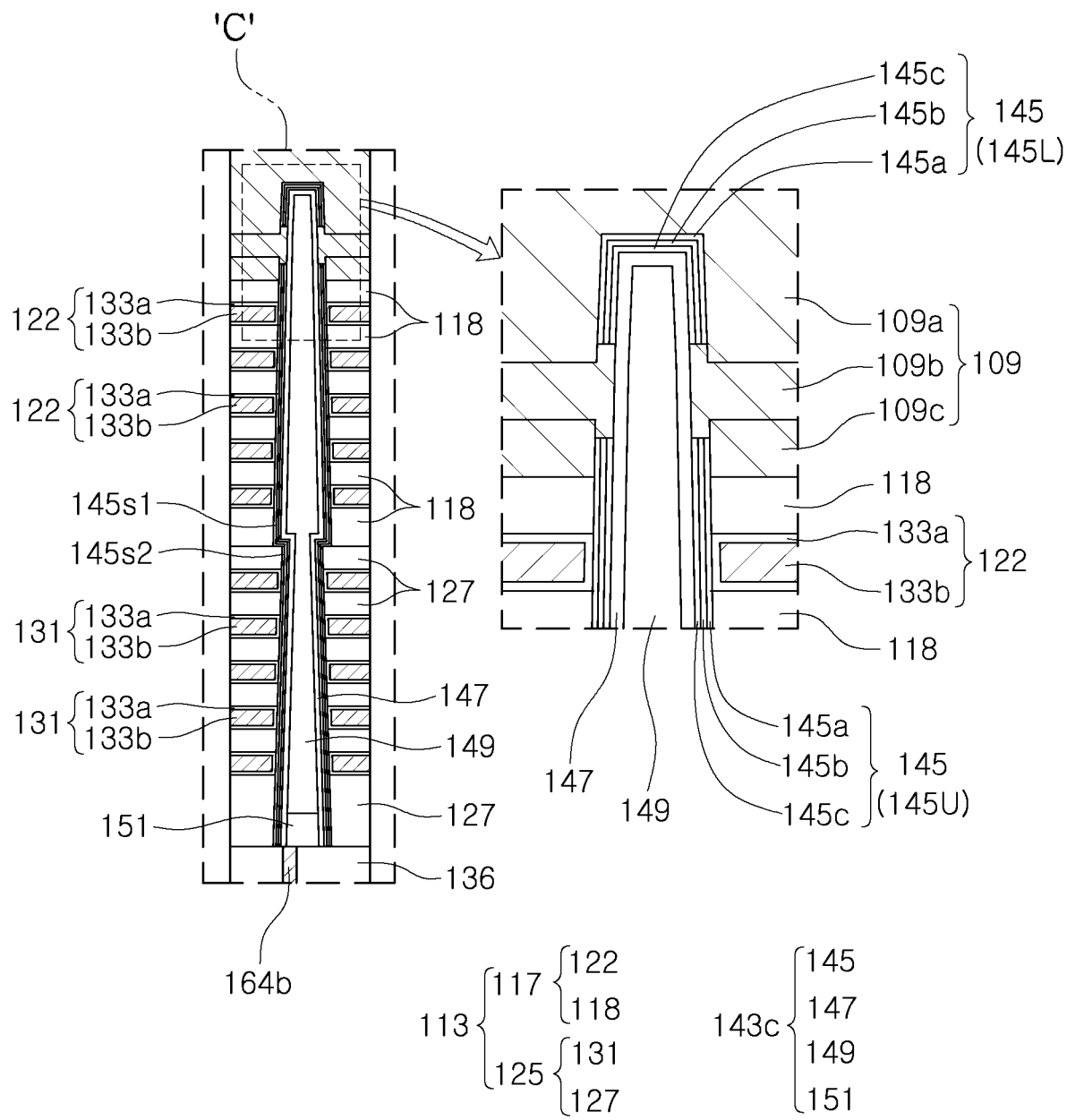
FIG. 5A is a partially enlarged cross-sectional view illustrating an example of the semiconductor device, according to an example embodiment.

Next, the description describes an example embodiment of the memory vertical structures 143c. FIG. 5A is an enlarged cross-sectional view illustrating a region indicated by "C" in FIG. 3A. Hereinafter, referring to FIG. 5A, the description is made focusing on any one of the memory vertical structures 143c and describes example embodiments of the horizontal gate layers 122 and 131 and the pattern structure 109.

Referring to FIGS. 3A and 5A, in an example embodiment, the pattern structure 109 may include a plurality of layers. For example, the pattern structure 109 may include a first pattern layer 109a, a second pattern layer 109b disposed under and contacting the first pattern layer 109a, and a third pattern layer 109c disposed under and contacting the second pattern layer 109b. At least one of the first pattern layer 109a, the second pattern layer 109b, and the third pattern layer 109c may include a polysilicon layer. For example, each of the first pattern layer 109a, the second pattern layer 109b, and the third pattern layer 109c may include the polysilicon layer. At least one of the first pattern layer 109a, the second pattern layer 109b, and the third pattern layer 109c may include the polysilicon layer having the N-type conductivity.

The memory vertical structures 143c may penetrate through the stack structure 113 and extend into the pattern structure 109.

The memory vertical structures 143c may include a core region 149, a channel layer 147, a pad pattern 151, and a data storage structure 145.

The channel layer 147 may cover the side surface and bottom surface of the core region 149. The channel layer 147 may be formed of a semiconductor material such as silicon. For example, the channel layer 147 may be formed of polysilicon.

The core region 149 may be formed of silicon oxide or silicon oxide having a void or a seam therein.

The pad pattern 151 may be disposed on the core region 149 and in contact with the core region 149 and the channel layer 147. The pad pattern 151 may be formed of polysilicon having the N-type conductivity.

In an example embodiment, the data storage structure 145 may cover an upper surface of the channel layer 147 by covering an outer side surface of the channel layer 147. Here, the upper surface of the channel layer 147 may be the upper surface of the channel layer 147 as viewed with reference to FIG. 5A.

In an example embodiment, the second pattern layer 109b may penetrate through the data storage structure 145 and be in contact with the channel layer 147, and the first and third pattern layers 109a and 109c may be spaced apart from the channel layer 147 by the data storage structure 145. The data storage structure 145 may include a first data storage structure 145U disposed at its lower portion and a second data storage structure 145L disposed at its upper portion. The first data storage structure 145U may be separated from the second data storage structure 145L by the second pattern layer 109b.

The data storage structure 145 may include a first dielectric layer 145a, a second dielectric layer 145c, and a data storage layer 145b disposed between the first dielectric layer 145a and the second dielectric layer 145c. At least one of the first and second dielectric layers 145a and 145c may include silicon oxide and/or a high-k dielectric.

In an example embodiment, the data storage layer 145b may include a material capable of trapping an electric charge, for example, silicon nitride. The data storage layer 145b may be a charge trap layer.

In an example embodiment, the data storage layer 145b may include regions capable of storing data in a semiconductor device such as a NAND flash memory device. For example, the data storage layer 145b may include the data storage regions capable of storing data between the gate layer, which may be the word lines among the horizontal gate layers 122 and 131, and the channel layer 147. Such data storage regions may each configure memory cells capable of storing data and may be arranged in one memory vertical structures 143c in a substantially vertical direction, and the plurality of memory vertical structures 143c including such data storage regions may be arranged in the horizontal direction. Accordingly, the plurality of memory vertical structures 143c including the plurality of data storage regions capable of configuring the memory cells may be disposed, and the semiconductor device 1 may thus include a memory cell array region including the memory cells arranged in the three dimensions. Here, the memory cell array region may be defined as regions of the first and second stacked groups 113Ga and 113Gb in which the memory vertical structures 143c are disposed. For another example, the memory vertical structures 143c may include a data storage region of a memory device that stores data using a change in resistance. For example, the memory vertical structures 143c may include a data storage structure of Resistive RAM (ReRAM) including any one of silicon oxide (SiOx), aluminum oxide (AlOx), magnesium oxide (MgOx), zirconium oxide (ZrOx), hafnium oxide (HfOx), silicon nitride (SiNx), tungsten oxide (WOx), and titanium oxide (TiOx), or a composite material including at least two of those materials. Alternatively, the memory vertical structures 143c may include a data storage structure of a PRAM including a phase change memory material such as a chalcogenide material including germanium (Ge), antimony (Sb), and/or tellurium (Te).

In the example embodiments, the memory vertical structures 143c may be referred to as a vertical structure, a vertical pattern, or the like.

Each of the horizontal gate layers 122 and 131 may include a first layer 133a and a second layer 133b. The first layer 133a may cover the upper and lower surfaces of the second layer 133b and extend to a space between the memory vertical structures 143c and a side surface of the second layer 133b.

In an example embodiment, the first layer 133a may include a dielectric material, and the second layer 133b may include a conductive material. For example, the first layer 133a may include a high-k dielectric such as AlO, and the second layer 133b may include a conductive material such as titanium nitride (TiN), tungsten nitride (WN), titanium (Ti), or tungsten (W).

For another example, the first layer 133a may include a first conductive material (e.g., titanium nitride (TiN) or tungsten (W)), and the second layer 133b may include a second conductive material (e.g., titanium (Ti) or tungsten (W)) different from the first conductive material.

For another example, each of the horizontal gate layers 122 and 131 may be formed of doped polysilicon, a metal-semiconductor compound (e.g., titanium silicide (TiSi), tantalum silicide (TaSi), cobalt silicide (CoSi), nickel silicide (NiSi), or tungsten silicide (WSi)), a metal nitride (e.g., titanium nitride (TiN), tantalum nitride (TaN), or tungsten nitride (WN)) or a metal (e.g., titanium (Ti) or tungsten (W)).

As described above, the stack structure 113 may include the first stacked region 125 and the second stacked region 117.

Each of the memory vertical structures 143c may include a lower vertical portion 145s2 penetrating through the first stacked region 125 and an upper vertical portion 145s1 penetrating through the second stacked region 117.

In an example embodiment, a side surface of the lower vertical portion 145s2 and a side surface of the upper vertical portion 145s1 adjacent to each other may not be aligned in the vertical direction. Accordingly, a side surface of the memory vertical structures 143c may have a bent portion in a region between the first horizontal conductive layers 131 of the first stacked region 125 and the second horizontal gate layers 122 of the second stacked region 117. For example, a portion of the side surface of the memory vertical structures 143c may extend in a horizontal direction, and may be coplanar with a surface of one of the second interlayer insulating layers 118.

In an example embodiment, the upper vertical portion 145s1 of the memory vertical structures 143c, which is adjacent to the lower vertical portion 145s2, may have a width greater than the lower vertical portion 145s2 thereof, which is adjacent to the upper vertical portion 145s1.

Figure 5B:
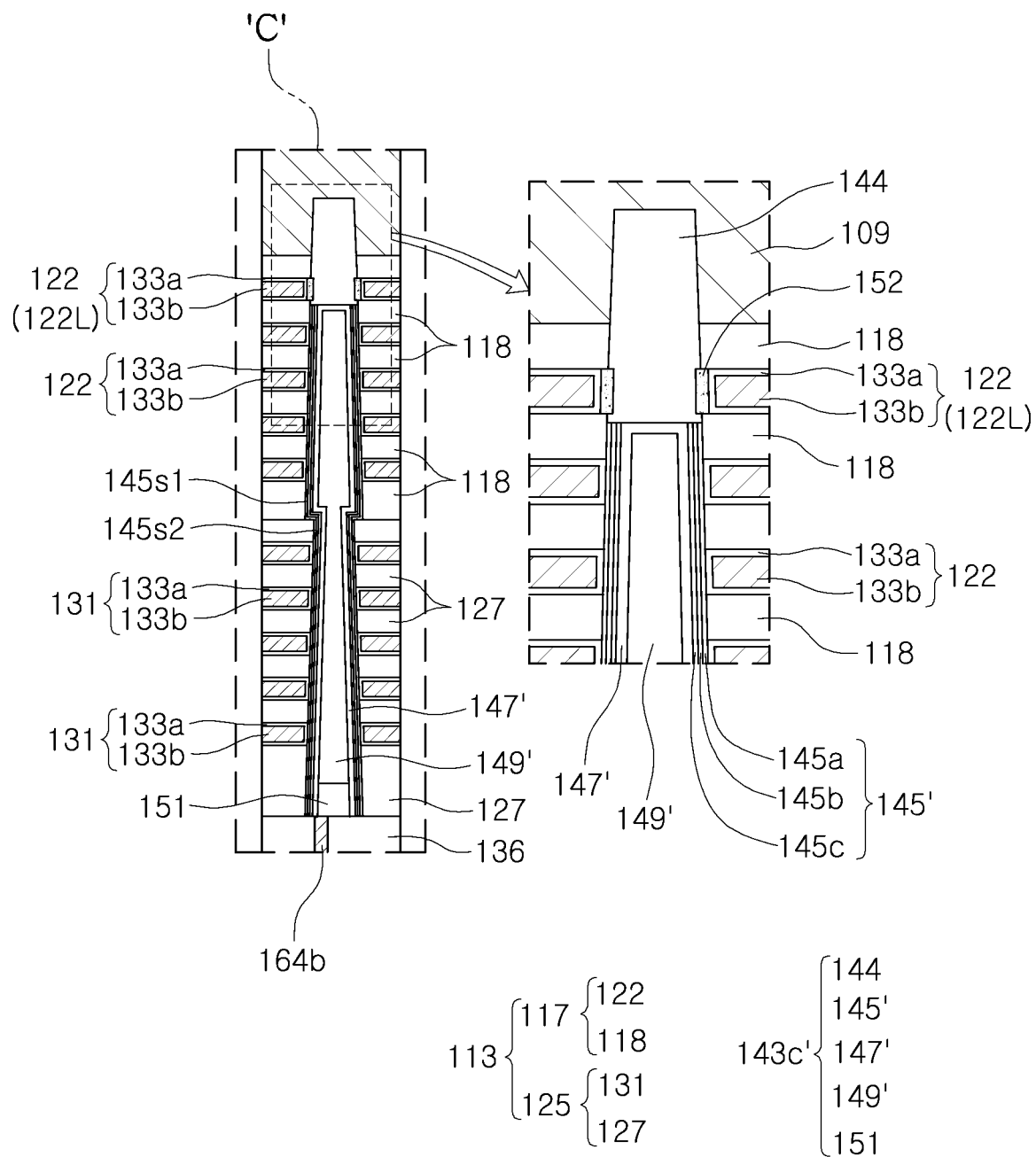
FIG. 5B is a partially enlarged cross-sectional view illustrating a modified example of the semiconductor device, according to an example embodiment.

Next, a modified example of the memory vertical structures 143c is described with reference to FIG. 5B. FIG. 5B is a partially enlarged view corresponding to the partially enlarged view of FIG. 5A. Hereinafter, the description is made focusing on the modified portion of the memory vertical structures 143c described with reference to FIG. 5A.

Referring to FIG. 5B, a memory vertical structures 143c' penetrating through the stack structure 113 and extending into the pattern structure 109 may include: an epitaxial channel layer 144 including a portion disposed in the pattern structure 109, disposed at a level lower than a lower surface of at least the lowermost horizontal gate layer 122L and having an upper surface disposed at a level higher than an upper surface of the next-lowest horizontal gate layer, among the horizontal gate layers 122 and 131; a core region 149' disposed under the epitaxial channel layer 144; a channel layer 147' interposed between the core region 149' and the epitaxial channel layer 144 and covering a side surface of the core region 149'; and a data storage structure 145' covering an outer side surface of the channel layer 147'. The data storage structure 145' may include the first dielectric layer 145a, the second dielectric layer 145c, and the data storage layer 145b disposed between the first and second dielectric layers 145a and 145c.

In an example embodiment, a dielectric layer 152 may be disposed between the lowermost horizontal gate layer 122L and the epitaxial channel layer 144.

Figure 6:
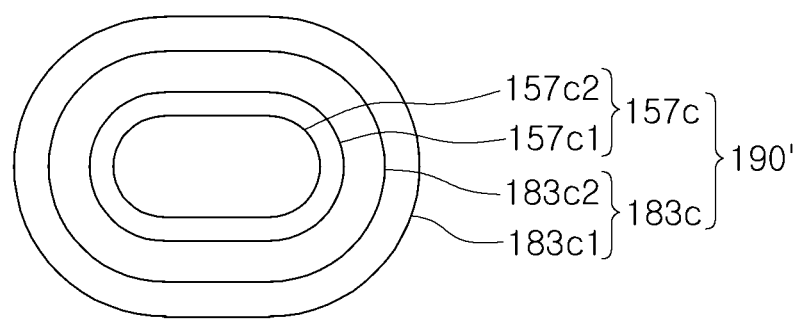
FIG. 6 is a plan view illustrating a modified example of a component of the semiconductor device, according to an example embodiment.

In the example embodiments, the contact structure 190 may have a circular shape when viewed as a plane as illustrated in FIG. 1. However, the planar shape of the contact structure 190 is not limited to the circular shape. The description describes such a modified example of the planar shape of the contact structure 190 with reference to FIG. 6. FIG. 6 is a plan view illustrating a modified example of the planar shape of the contact structure.

Referring to FIG. 6, a contact structure 190' may have an elongated shape in one direction, for example, an oval shape, a rectangular shape, a bar shape, or a line shape. For example, the lower contact structure 157c of the contact structure 190', which includes the lower contact plug 157c2 and the lower spacer 157c1 may have the elongated shape in one direction, and the upper contact structure 183c thereof, which includes the upper contact plug 183c2 and the upper spacer 183c1 may have the elongated shape in one direction. In example embodiments, the lower contact structure 157c and the upper contact structure 183c may both have shapes that are elongated in the one direction.

Figure 7:
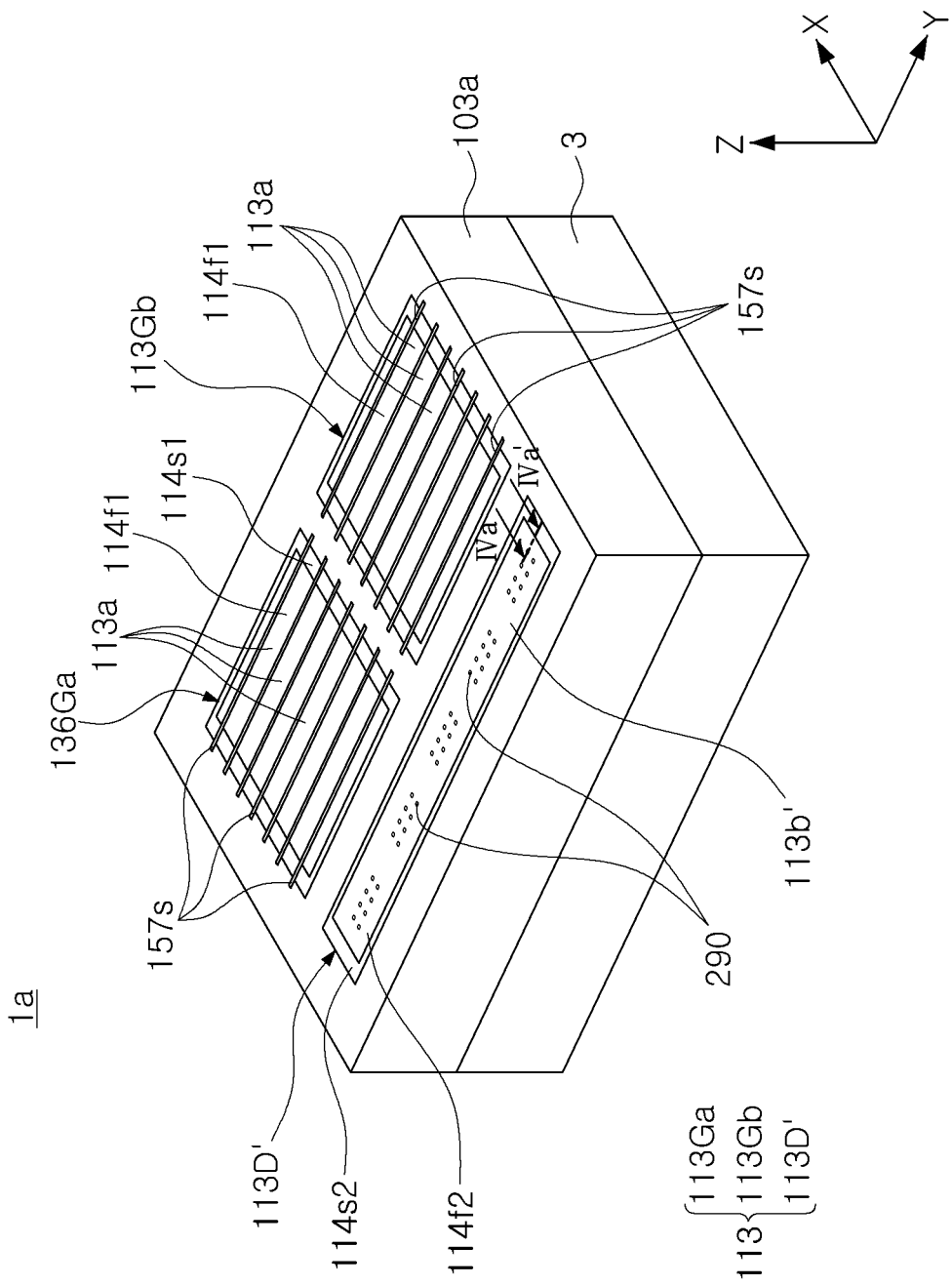
FIGS. 7 and 8 are views illustrating a modified example of the semiconductor device, according to an example embodiment.
Figure 8:
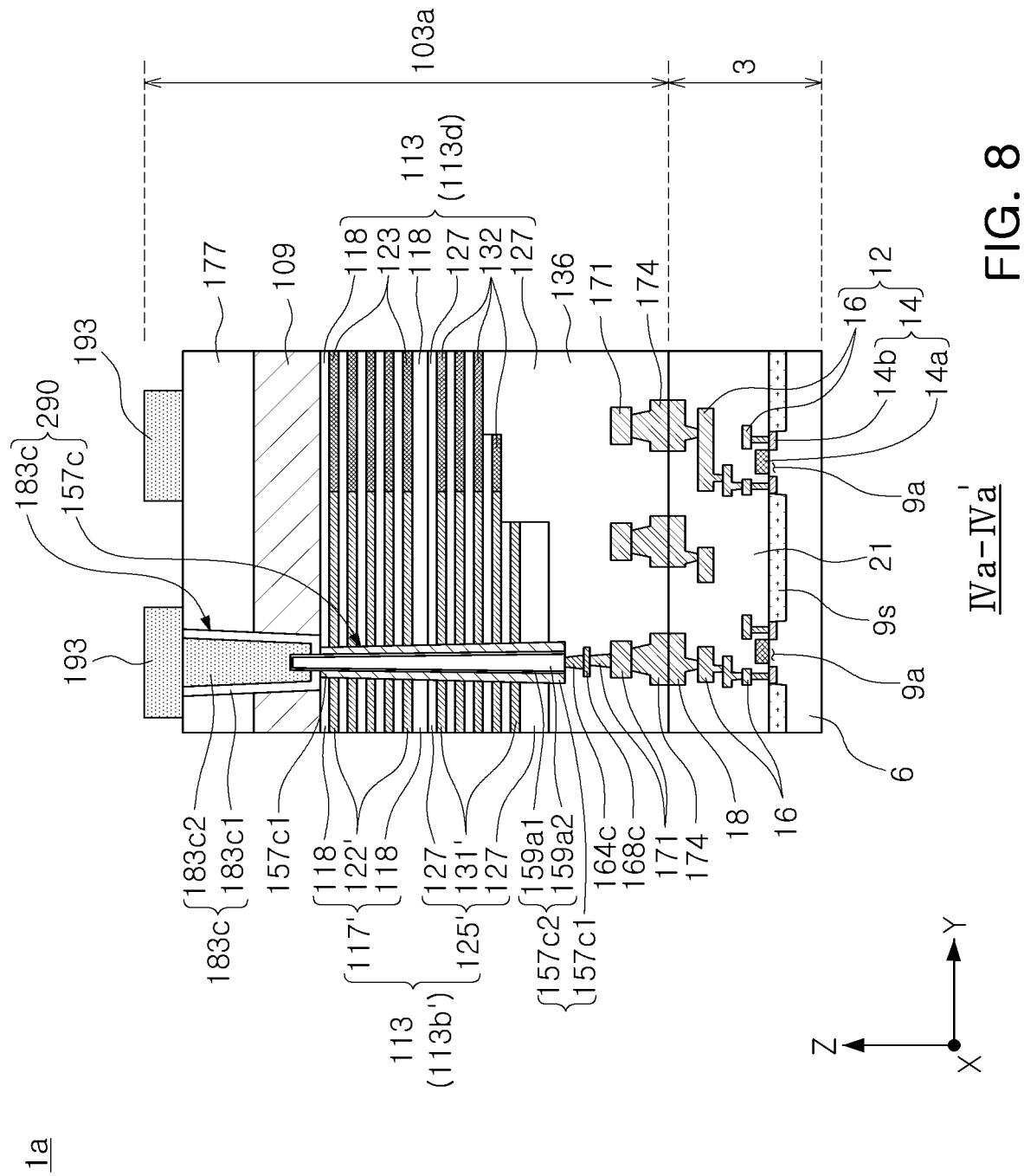

Next, a modified example of the semiconductor device 1 according to an example embodiment is described with reference to FIGS. 7 and 8. FIG. 7 is a schematic perspective view illustrating the modified example of the semiconductor device according to an example embodiment; and FIG. 8 is a schematic cross-sectional view illustrating a region taken along line IVa-IVa' of FIG. 7. Hereinafter, the description is made focusing on a portion modified from the semiconductor device 1 described with reference to FIGS. 1 through 3D.

Referring to FIGS. 7 and 8, a semiconductor device 1a according to an example embodiment may include the first structure 3 and a second structure 103a. The first structure 3 may be substantially the same as that described with reference to FIGS. 1 through 3D. The second structure 103a may include first and second gate groups 113Ga and 113Gb including the first stack portions 113a without including the second stack portions (e.g., the second stack portions 113b in FIG. 1), instead of the first and second stack groups 113Ga and 113Gb including the first stack portions (e.g., the first stack portions 113a in FIG. 1) and the second stack portions (e.g., the second stack portions 113b in FIG. 1) described with reference to FIG. 1.

The second structure 103a may include a dummy stacked group 113D' including a second stack portion 113b', instead of the dummy stacked group 113D described with reference to FIGS. 1 through 3D.

The dummy stacked group 113D' may further include a dummy stack portion 113d in contact with the second stack portion 113b'.

The second stack portion 113b' of the dummy stacked group 113D' may be formed of layers substantially the same as the first and second stack portions 113a and 113b of the first and second stacked groups 113Ga and 113Gb described with reference to FIGS. 1 to 3D. For example, the second stack portion 113b' of the dummy stacked group 113D' may include the interlayer insulating layers 118 and 127 and horizontal gate layers 122' and 131', which are alternately and repeatedly stacked on each other. The dummy stack portion 113d of the dummy stacked group 113D' may include the interlayer insulating layers 118 and 127 and horizontal insulating layers 123 and 132, which are alternately and repeatedly stacked on each other.

The second stack portion 113b' of the dummy stacked group 113D' may include a first stacked region 125' and a second stacked region 117' disposed on the first stacked region 125'. The first stacked region 125' may include the first interlayer insulating layers 127 and the first horizontal gate layers 131' which are alternately and repeatedly stacked on each other, and the second stacked region 117' may include the second interlayer insulating layers 118 and the second horizontal gate layers 122' which are alternately and repeatedly stacked on each other.

The second structure 103a may include a contact structure 290 having the same structure as the contact structure 190 described with reference to FIGS. 1 to 3D. For example, the contact structure 290 may include the lower contact structure 157c penetrating through the second stack portion 113b' of the dummy stacked group 113D' and the upper contact structure 183c penetrating through the pattern structure 109 and the upper insulating layer 177. Here, the lower contact structure 157c and the upper contact structure 183c may be substantially the same as the structures of the lower contact structure 157c and the upper contact structure 183c described with reference to FIGS. 1 to 3D.

In an example embodiment, the contact structure 290 may be modified like any one of the modified examples of the contact structure 190 described with reference to FIGS. 4A to 4D and 6.

Figure 9:
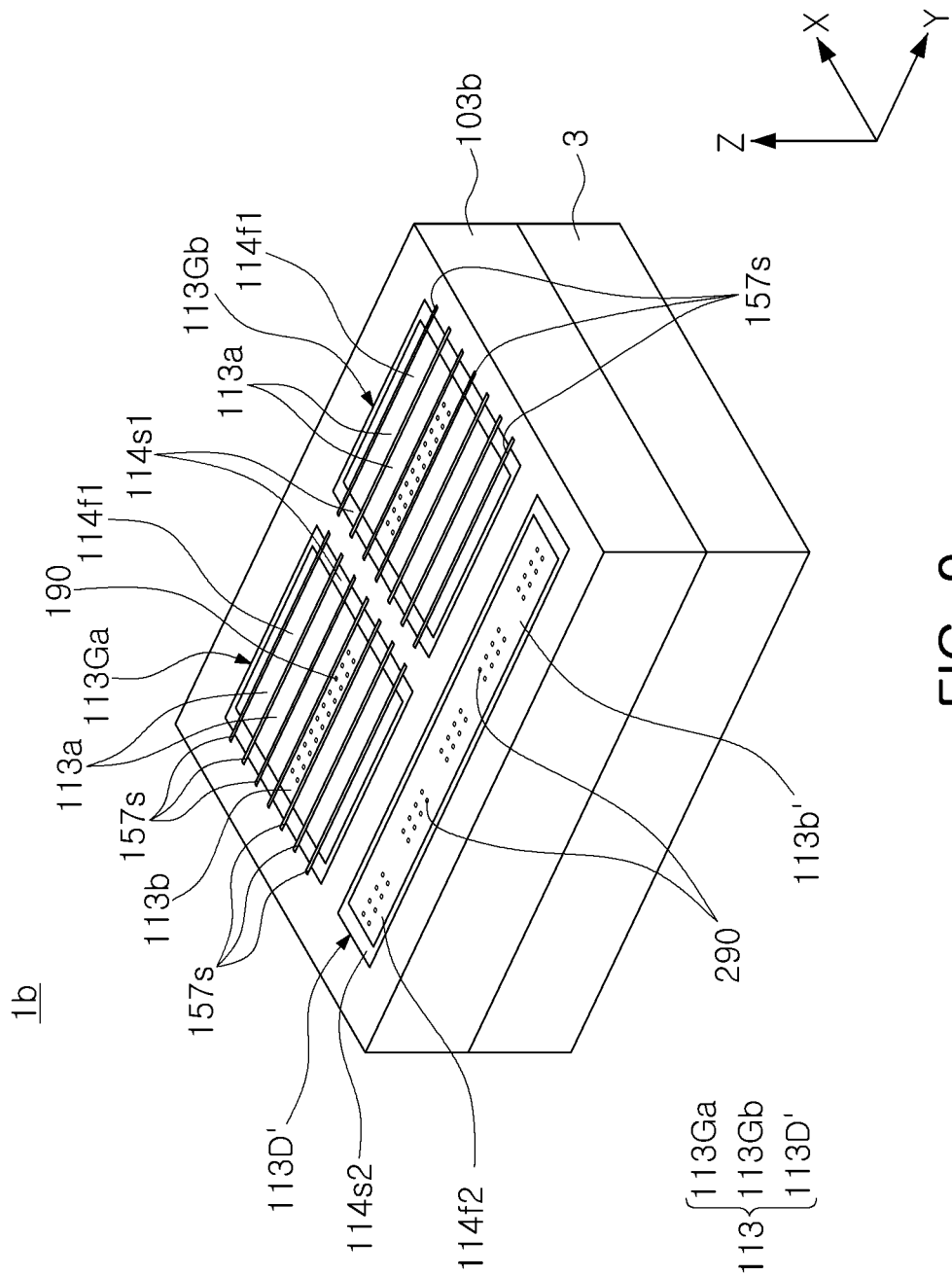
FIG. 9 is a perspective view illustrating another modified example of the semiconductor device, according to an example embodiment.

Next, another modified example of the semiconductor device 1 according to an example embodiment is described with reference to FIG. 9. FIG. 9 is a schematic perspective view illustrating the modified example of the semiconductor device according to an example embodiment. Hereinafter, the description is made focusing on a portion modified from the semiconductor devices 1 and 1a described with reference to FIGS. 1 through 8.

Referring to FIG. 9, a semiconductor device 1b according to an example embodiment may include the first structure 3 and a second structure 103b. The first structure 3 may be substantially the same as that described with reference to FIGS. 1 to 3D. The second structure 103b may include: the first and second stack groups 113Ga and 113Gb including the first stack portions (e.g., the first stack portions 113a in FIG. 1) and the second stack portions (e.g., the second stack portions 113b in FIG. 1) described with reference to FIG. 1; the dummy stacked group 113D' including the second stack portion 113b' described with reference to FIG. 7; the contact structure 190 described with reference to FIGS. 1 to 3D; and the contact structure 290 described with reference to FIGS. 7 and 8.

In an example embodiment, the contact structures 190 and 290 may each be modified like any one of the modified examples of the contact structure 190 described with reference to FIGS. 4A to 4D and 6.

In the example embodiments, the contact structure 190 described with reference to FIGS. 1 to 3D may be referred to as a first contact structure, and the contact structure 290 described with reference to FIGS. 7 and 8 may be referred to as a second contact structure.

Figure 10:
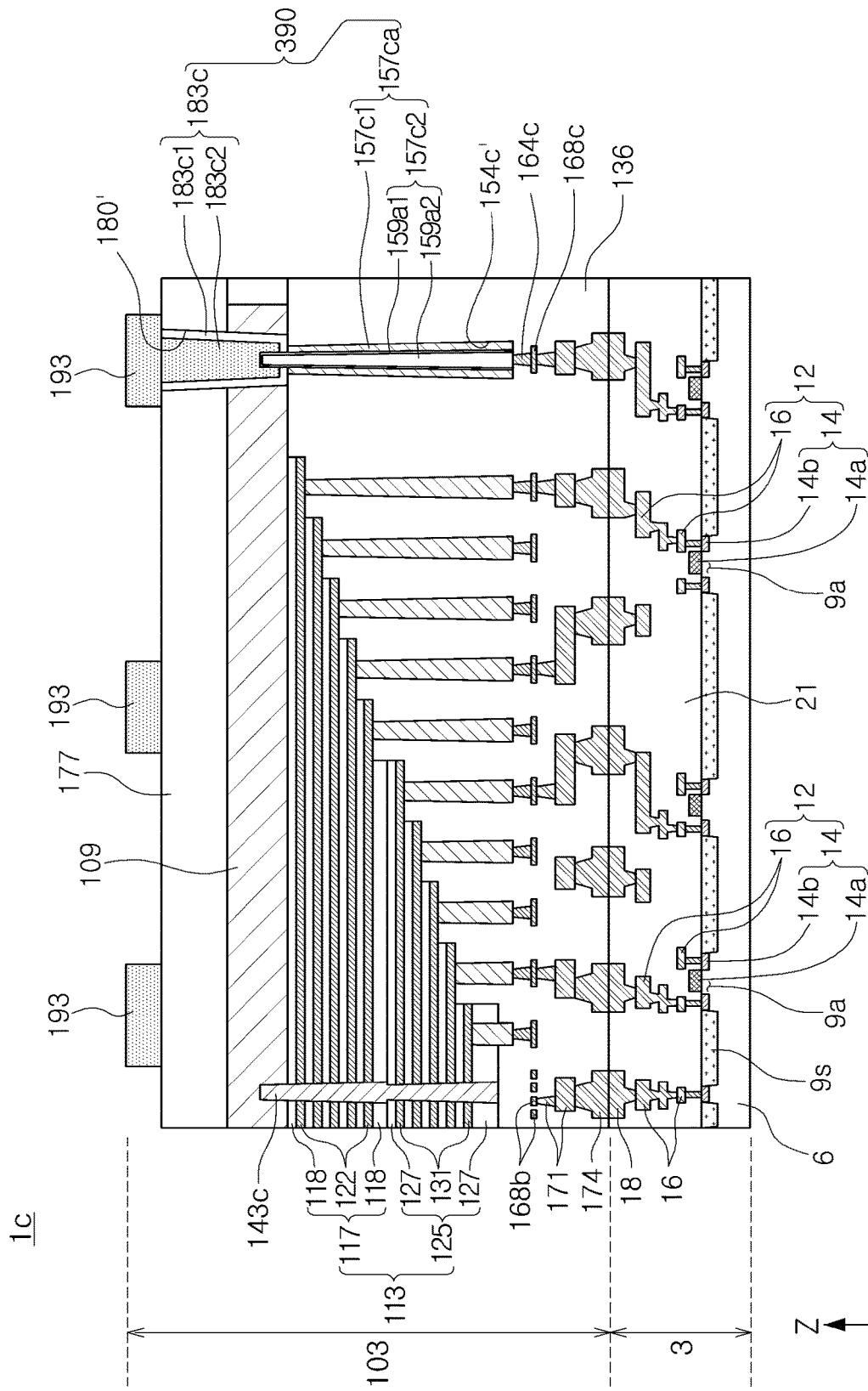
FIG. 10 is a cross-sectional view illustrating a modified example of the semiconductor device, according to an example embodiment.

Next, another modified example of the semiconductor device 1 according to an example embodiment is described with reference to FIG. 10. FIG. 10 is a cross-sectional view illustrating a region taken along line III-III' of FIG. 1.

Referring to FIGS. 1 and 10, the modified example may provide a semiconductor device 1*c* according to an example embodiment, and the second structure 103 may further include a third contact structure 390 spaced apart from the stack structure 113 without penetrating through the stack structure 113.

The third contact structure 390 may include the lower contact structure 157*ca* penetrating through the capping insulating layer 136, and the upper contact structure 183*c* penetrating through the pattern structure 109 and the upper insulating layer 177. Here, the lower contact structure 157*ca* and the upper contact structure 183*c* may be substantially the same as the structures of the lower contact structure 157*c* and the upper contact structure 183*c* described with reference to FIGS. 1 to 3D.

In an example embodiment, the third contact structure 390 may be modified like any one of the modified examples of the contact structure 190 described with reference to FIGS. 4A to 4D and 6.

Figure 12B:
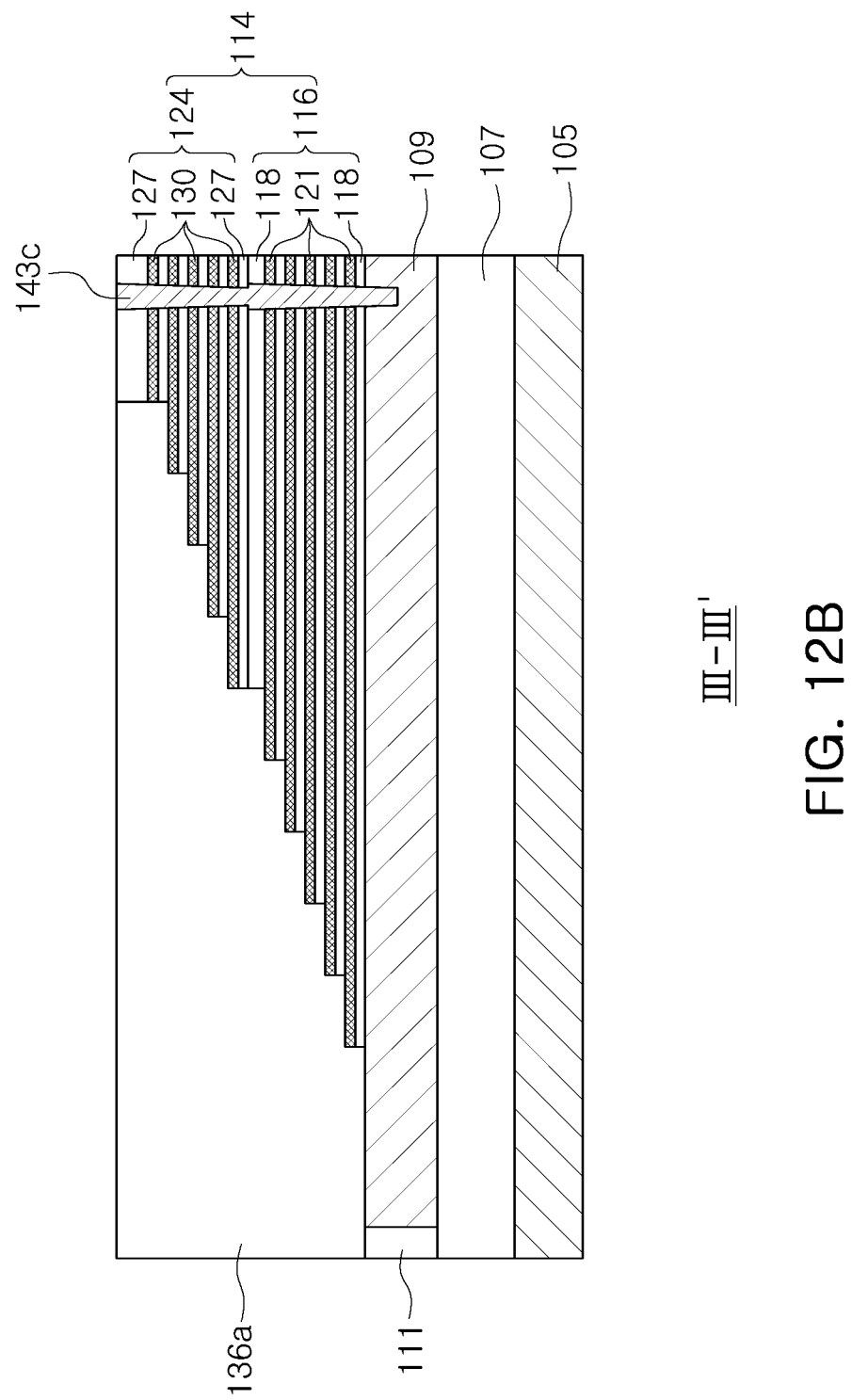
Figure 13A:
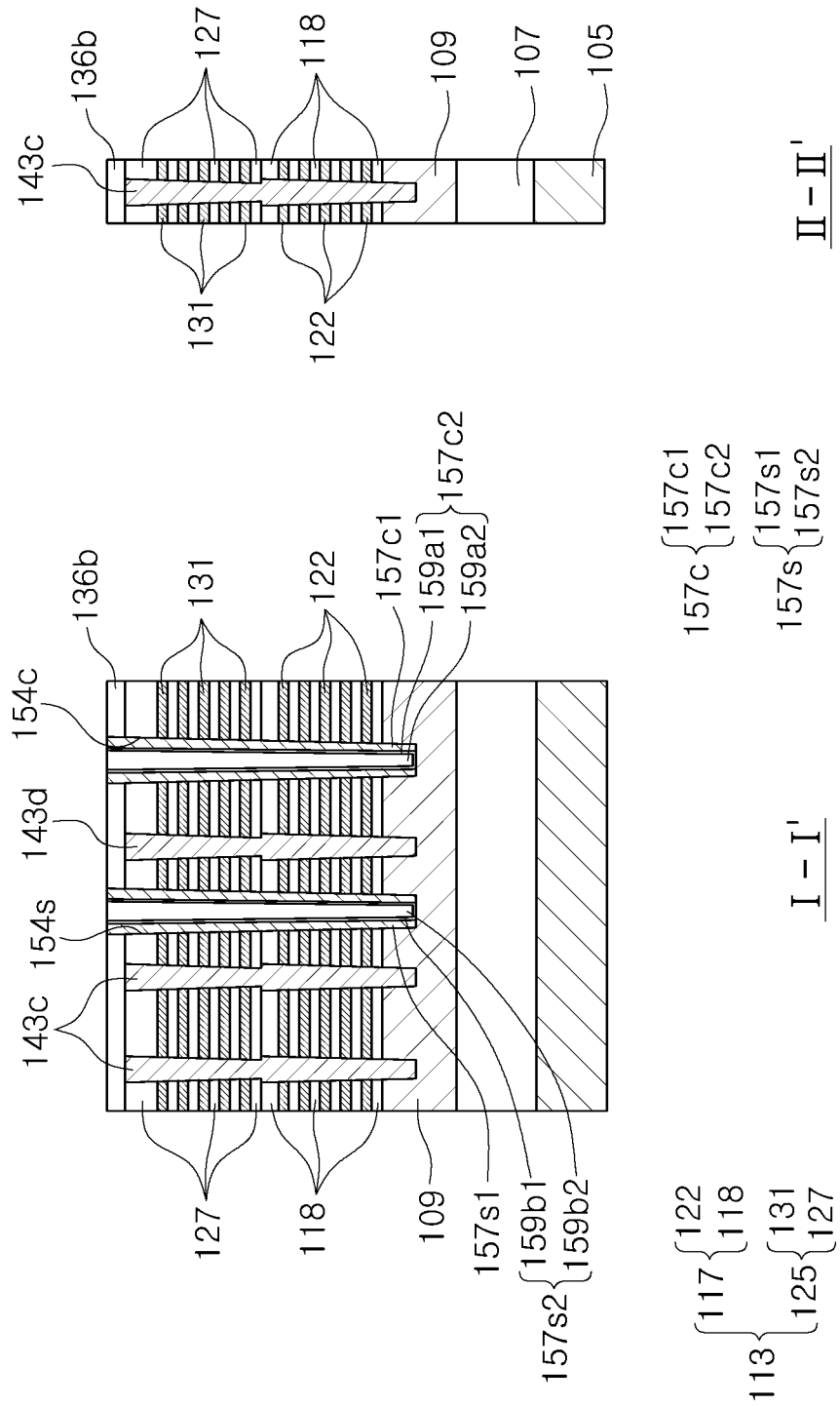
Figure 13B:
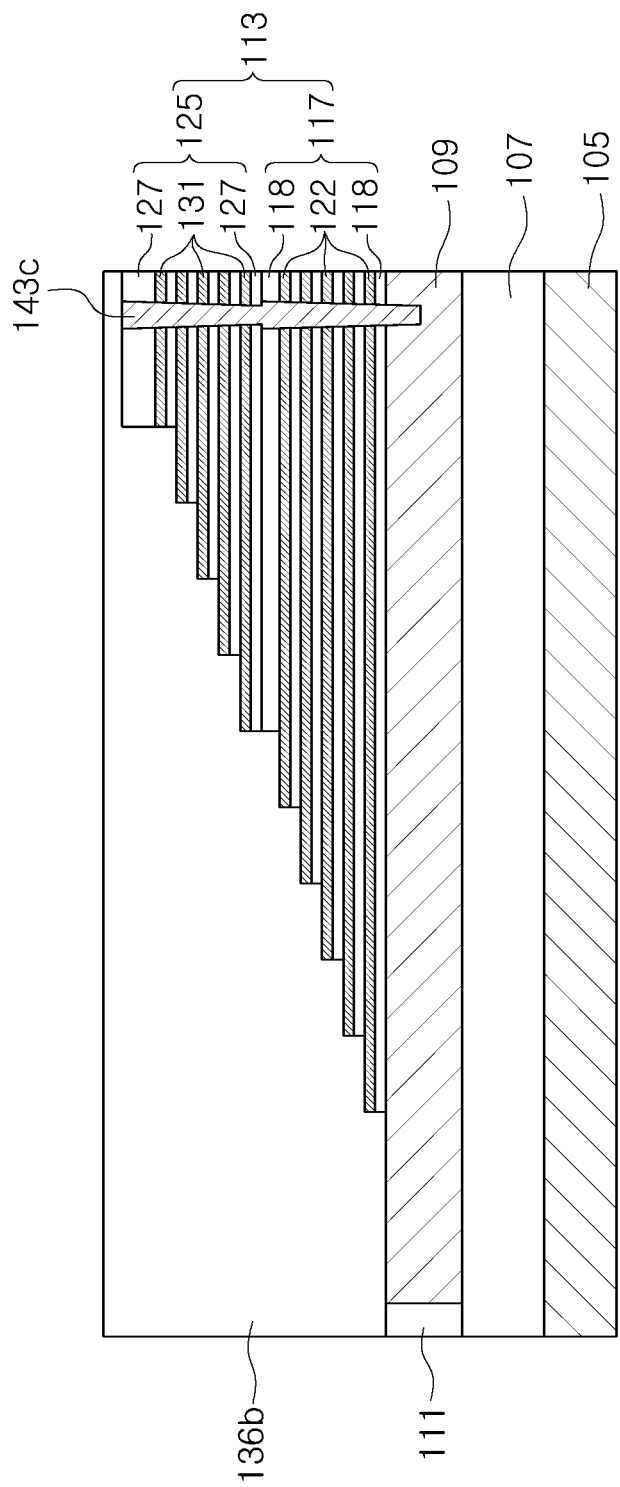
Figure 13C:
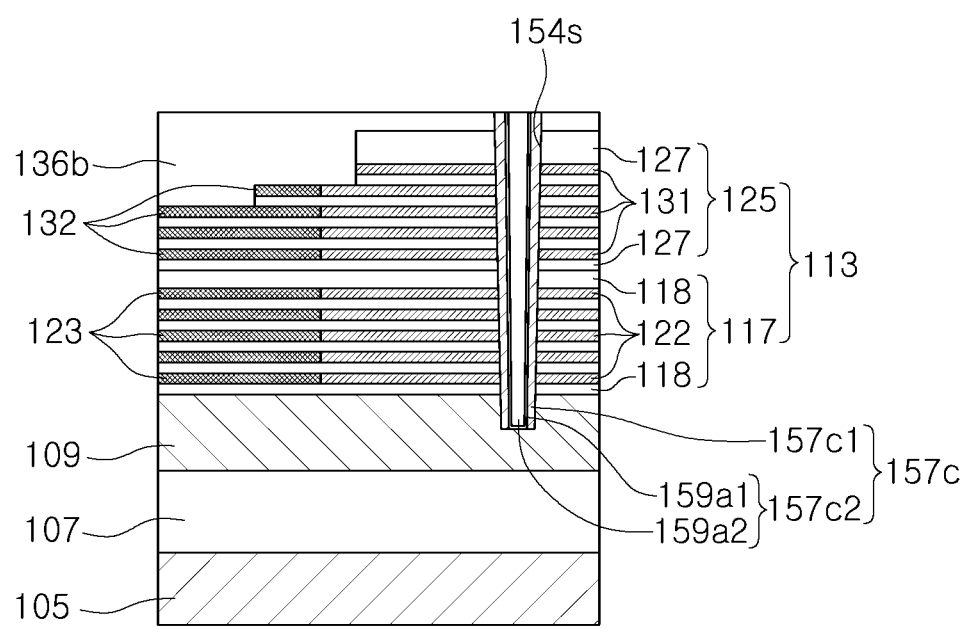
Figure 14A:
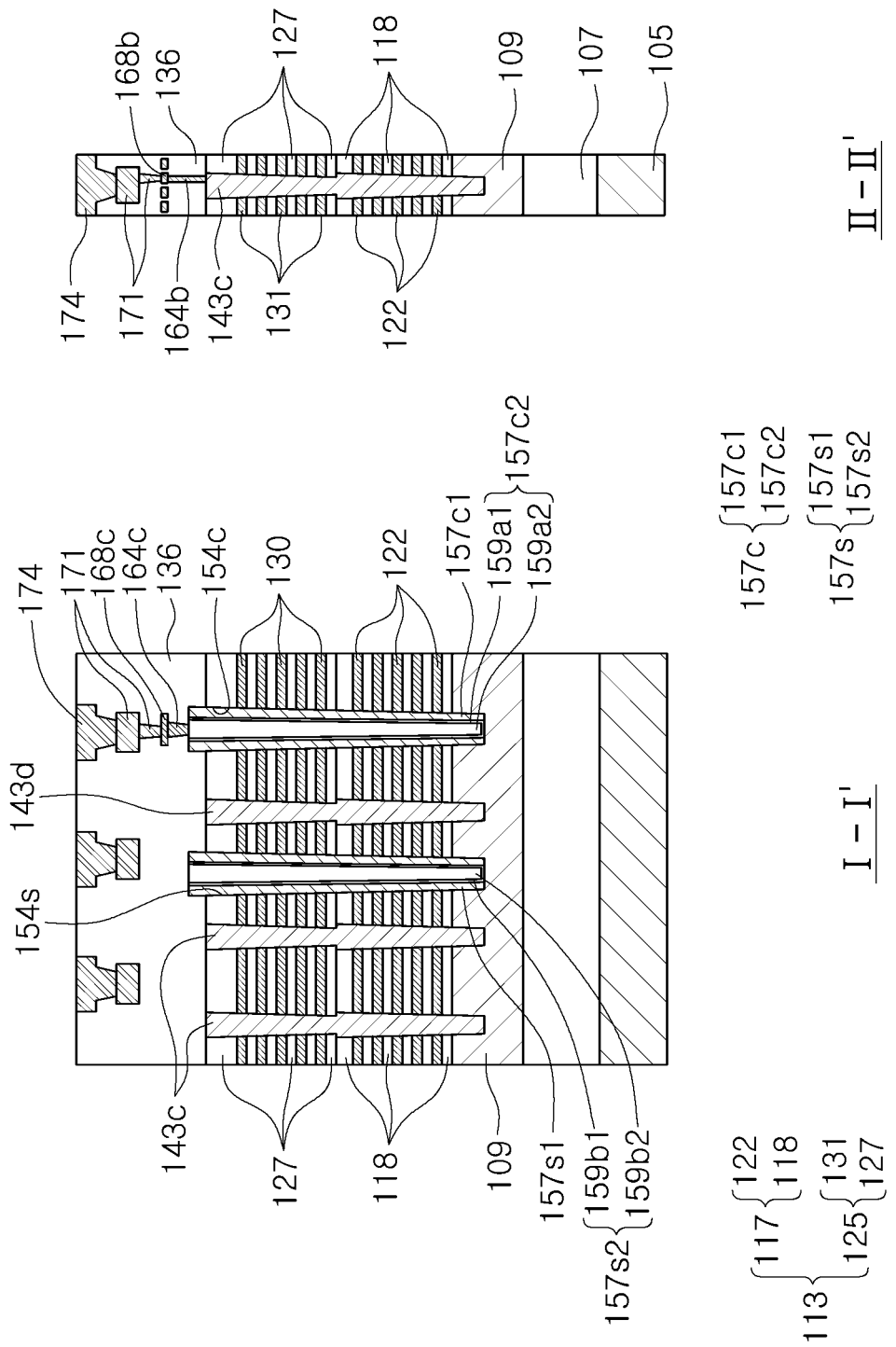
Figure 14B:
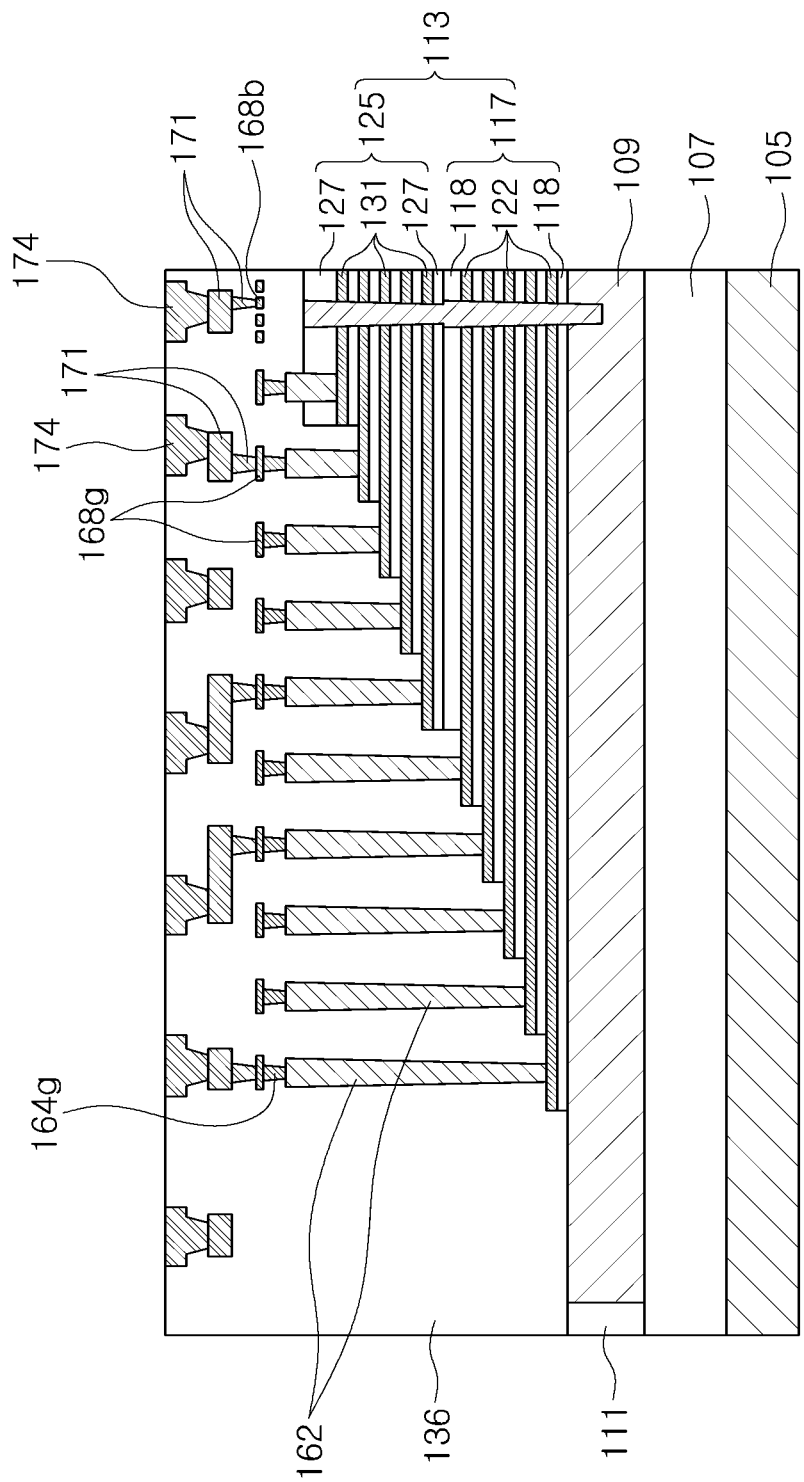
Figure 14C:
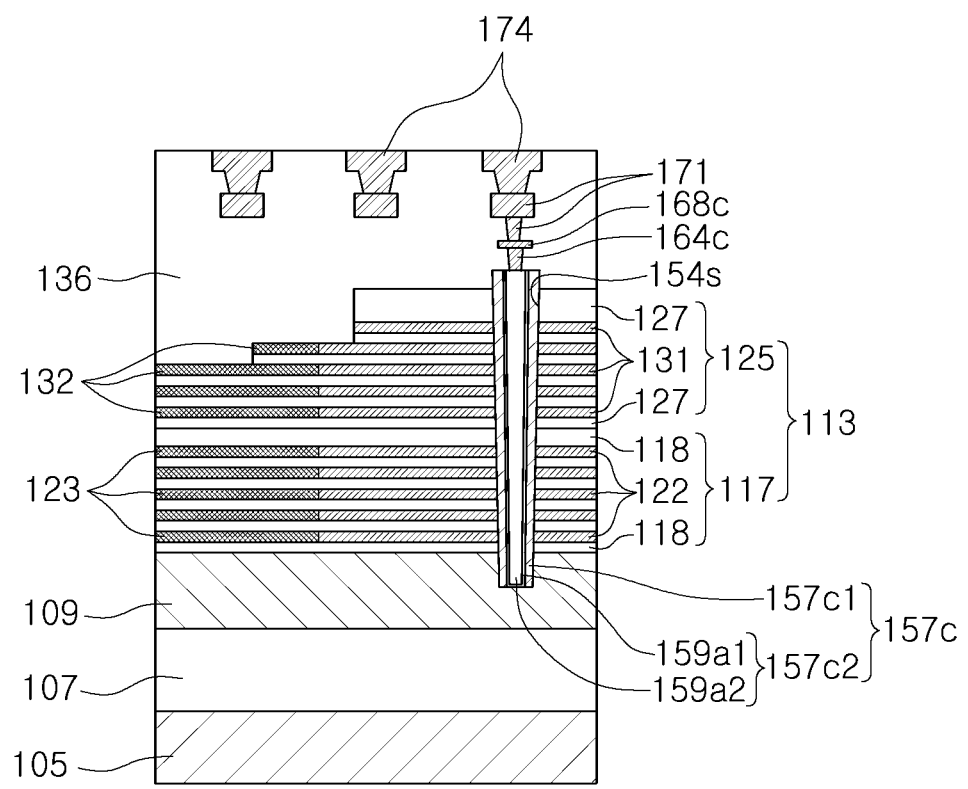

Next, an example of a method of manufacturing a semiconductor device according to an example embodiment is described with reference to FIGS. 11 to 14C. Among FIGS. 11 to 14C, FIG. 11 is a cross-sectional view illustrating a method of forming a cross-sectional structure of a first structure 3 in a region taken along lines I-I' and II-II' of FIG. 2; FIGS. 12A, 13A and 14A are cross-sectional views each illustrating a method of forming a cross-sectional structure of a second structure 103 in the region taken along lines I-I' and II-II' of FIG. 2; FIGS. 12B, 13B and 14B are cross-sectional views each illustrating a method of forming a cross-sectional structure of the second structure 103 in a region taken along line III-III' of FIG. 1; and FIGS. 12C, 13C and 14C are cross-sectional views each illustrating a method of forming a cross-sectional structure of a second structure 103*a* in a region taken along line IVa-IVa' of FIG. 7.

Figure 11:
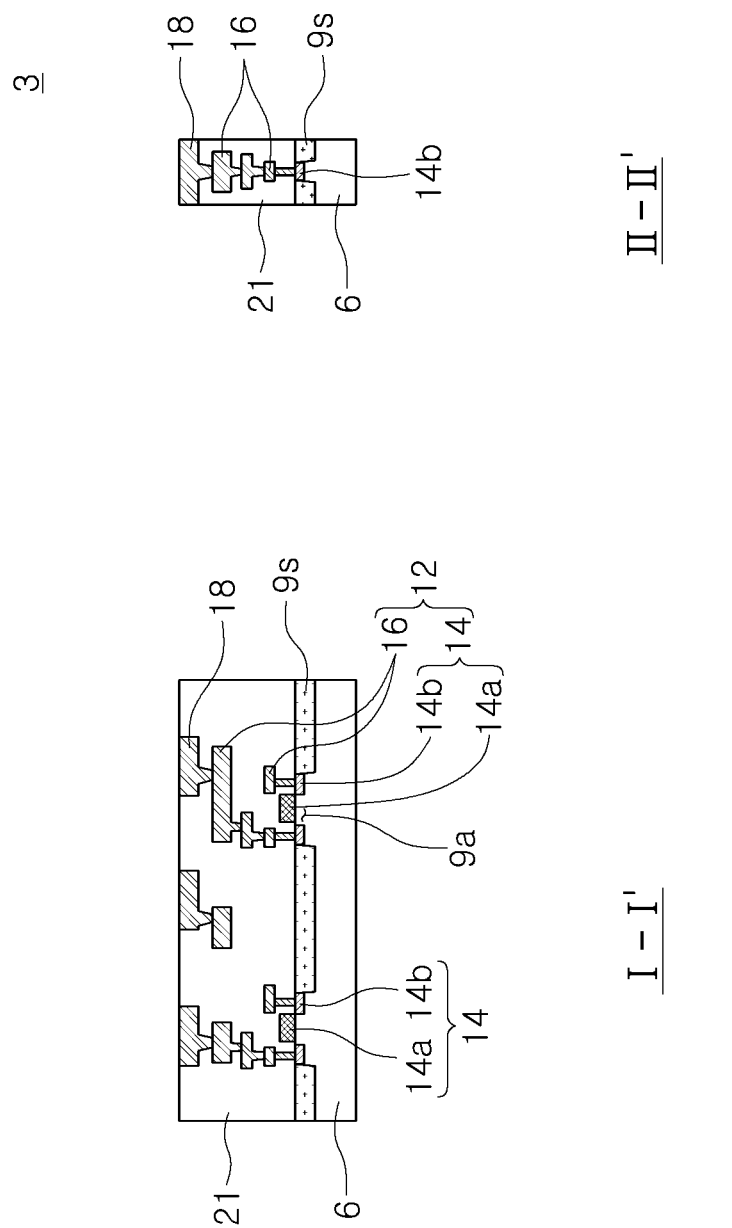

Referring to FIG. 11, the first structure 3 may be formed. The first structure 3 may include: a semiconductor substrate 6; an isolation region 9*s* disposed on the semiconductor substrate 6 and defining a peripheral active region 9*a*; a peripheral circuit 12 formed on the semiconductor substrate 6; a first bonding pads 18 electrically connected to the peripheral circuit 12; and a first insulating structure 21 disposed on the semiconductor substrate 6, covering the peripheral circuit 12 and having an upper surface coplanar with an upper surface of the first bonding pads 18.

The peripheral circuit 12 may include a circuit device 14 such as a transistor including a peripheral gate 14*a* and a peripheral source/drain 14*b*, and a circuit interconnection 16 electrically connected to the circuit device 14. The circuit interconnection 16 may be electrically connected to the first bonding pads 18.

Figure 12C:
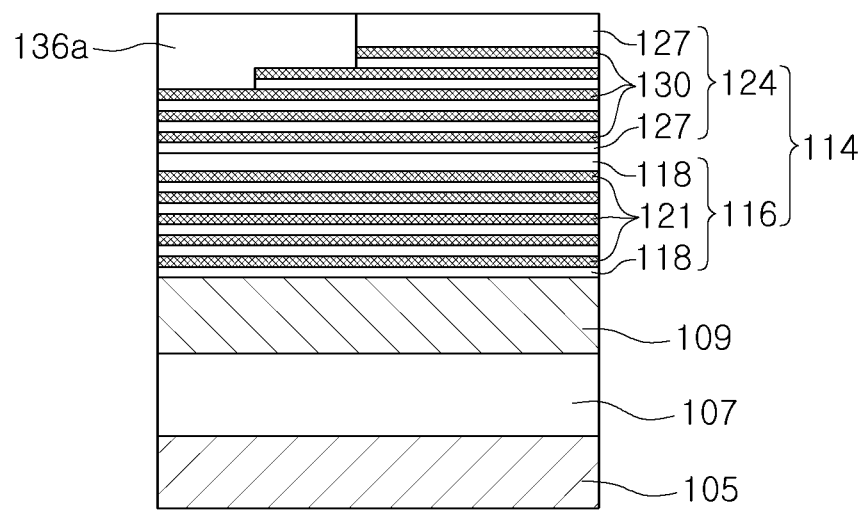

Referring to FIGS. 12A, 12B, and 12C, an insulating layer 107 may be formed on a substrate base 105 and a pattern structure 109 may be formed on the insulating layer 107.

In an example embodiment, the pattern structure 109 may include a polysilicon layer. For example, the pattern structure 109 may include the polysilicon layer having an N-type conductivity.

For another example, the pattern structure 109 may include a polysilicon layer having a P-type conductivity.

For still another example, the pattern structure 109 may include a polysilicon layer including a region having the N-type conductivity and a region having the P-type conductivity. For yet still another example, the pattern structure 109 may include a doped polysilicon layer and a pattern layer disposed on the doped polysilicon layer. The pattern layer may include a first layer, a second layer and a third layer sequentially stacked on one another. Here, the first layer and the third layer may each be a silicon oxide layer, and the second layer may be a silicon layer or a silicon nitride layer.

In another example embodiment, the substrate base 105 and the insulating layer 107 may be omitted, and the pattern structure 109 may include a single crystal silicon layer.

In an example embodiment, an outer insulating layer 111 may be formed on a side surface of the pattern structure 109.

A preliminary stack structure 115 and a preliminary capping insulating layer 136*a* may be formed on the pattern structure 109 and the outer insulating layer 111.

Forming the preliminary stack structure 115 and the preliminary capping insulating layer 136*a* may include the followings: forming a preliminary lower stack structure 116 on the pattern structure 109; forming a first preliminary upper insulating layer disposed on the pattern structure 109 and the outer insulating layer 111, covering a portion of the preliminary lower stack structure 116 and having an upper surface coplanar with an upper surface of the preliminary lower stack structure 116; forming a preliminary upper stack structure 124 on the preliminary lower stack structure 116; and forming a second preliminary upper insulating layer disposed on the first preliminary upper insulating layer, covering a portion of the preliminary upper stack structure 124 and having an upper surface coplanar with an upper surface of the preliminary upper stack structure 124. The first and second preliminary upper insulating layers may be formed of the same material as each other, for example, silicon oxide to form the preliminary capping insulating layer 136*a*.

Forming the preliminary lower stack structure 116 may include forming second interlayer insulating layers 118 and second preliminary horizontal layers 121 which are alternately stacked in a vertical direction Z, and patterning the second interlayer insulating layers 118 and the second preliminary horizontal layers 121 to form a step shape on at least one side. A lowermost layer and an uppermost layer among the second interlayer insulating layers 118 and the second preliminary horizontal layers 121 may each be one of the second interlayer insulating layers 118.

Forming the preliminary upper stack structure 124 may include forming first interlayer insulating layers 127 and first preliminary horizontal layers 130 to be alternately stacked in the vertical direction Z, and patterning the first interlayer insulating layers 127 and the first preliminary horizontal layers 130 to form a step shape on at least one side. A lowermost layer and an uppermost layer among the first interlayer insulating layers 127 and the first preliminary horizontal layers 130 may each be one of the first interlayer insulating layers 127.

The first and second interlayer insulating layers 127 and 118 may be formed of a first insulating material layer such as a silicon oxide layer. The first and second preliminary horizontal layers 130 and 121 may be formed of a material different from the first and second interlayer insulating layers 127 and 118, for example, a second insulating material layer such as a silicon nitride layer. For another example, the first and second preliminary horizontal layers 130 and 121 may be formed of a conductive material layer including at least one of doped polysilicon, metal nitride (e.g., titanium nitride (TiN), tungsten nitride (WN), or tantalum nitride (TaN)), metal-semiconductor compound (e.g., titanium silicide (TiSi), tantalum silicide (TaSi) or nickel silicide (NiSi)), or metal (e.g., tungsten (W)).

The preliminary stack structure 115 may include first preliminary stack structures 114a and a dummy preliminary stack structure 114b.

A plurality of memory vertical structures 143c penetrating through the first preliminary stack structures 114a may be formed. A dummy vertical structures 143d penetrating through the second preliminary stack structure 114b may be formed.

In an example embodiment, the plurality of memory vertical structures 143c and the dummy vertical structures 143d may be simultaneously formed. For example, the plurality of memory vertical structures 143c and the dummy vertical structures 143d may be formed at the same time and of the same materials.

For another example, the dummy vertical structures 143d may be formed after the plurality of memory vertical structures 143c are formed.

Referring to FIGS. 13A, 13B, and 13C, a preliminary capping insulating layer 136b having an increased upper surface may be formed by forming an additional preliminary capping insulating layer on the preliminary stack structure 115 and the preliminary capping insulating layer 136a.

Lower contact holes 154c and separation trenches 154s which pass through the preliminary capping insulating layer 136b and the preliminary stack structure 115 may be formed. The lower contact holes 154c and the separation trenches 154s may expose the first and second preliminary horizontal layers 130 and 121 of the preliminary stack structure 115.

An empty space may be formed by etching the first and second preliminary horizontal layers 130 and 121 exposed by the lower contact holes 154c and the separation trenches 154s, and first and second horizontal gate layers 131 and 122 may be formed in the respective empty spaces. For example, the second horizontal gate layers 122 may be formed in the empty spaces from which the second preliminary horizontal layers 121 are removed, and the first horizontal gate layers 131 may be formed in the empty spaces from which the first preliminary horizontal layers 130 are removed.

The preliminary lower stack structure 116 may be formed to be a second stacked region 117 including the horizontal gate layers 122 and the interlayer insulating layers 118, and the preliminary upper stack structure 124 may be formed to be a first stacked region 125 including the horizontal gate layers 131 and the interlayer insulating layers 127. The stack structure 113 may include the stacked regions 117 and 125. Here, the horizontal gate layers 122 and interlayer insulating layers 118 of the second stacked region 117 may be referred to as the second horizontal gate layers 122 and the second interlayer insulating layers 118, respectively, and the horizontal gate layers 131 and interlayer insulating layers 127 of the first stacked region 125 may be referred to as the first horizontal gate layers 131 and the first interlayer insulating layers 127, respectively.

In an example embodiment, a portion of the first preliminary horizontal layers 130 may remain as the horizontal insulating layers 132.

Lower contact structures 157c and separation structures 157s may each be formed in the lower contact holes 154c and the separation trenches 154s, respectively.

Forming the lower contact structures 157c and the separation structures 157s may include forming insulating spacers 157c1 and 157s1 respectively on sidewalls of the lower contact holes 154c and separation trenches 154s, and forming conductive patterns 157c2 and 157s2 respectively filling the lower contact holes 154c and the separation trenches 154s. Forming the conductive patterns 157c2 and 157s2 may include forming liner layers 159a1 and 159b1 uniformly covering inner walls of the lower contact holes 154c and separation trenches 154s in which the spacers 157c1 and 157s1 are formed, respectively, and forming pillar patterns 159a2 and 159b2 filling the lower contact holes 154c and the separation trenches 154s, respectively.

Among the liner layers 159a1 and 159b1, the liner layer formed in the lower contact holes 154c may be referred to as the first liner layer 159a1, and the liner layer formed in the separation trenches 154s may be referred to as the second liner layer 159b1. Among the pillar patterns 159a2 and 159b2, the pillar pattern formed in the lower contact holes 154c may be referred to as the first pillar pattern 159a2, and the pillar pattern formed in the separation trenches 154s may be referred to as the second pillar pattern 159b2.

Among the spacers 157c1 and 157s1, the spacer formed on the side surface of the lower contact holes 154c may be referred to as the lower spacer 157c1, and the spacer formed on the sidewall of the separation trenches 154s may be referred to as the separation spacer 157s1. Among the conductive patterns 157c2 and 157s2, the pattern formed in the lower contact holes 154c may be referred to as the lower contact plugs 157c2, and the conductive patterns formed in the separation trenches 154s may be referred to as the separation patterns 157s2.

Referring to FIGS. 14A, 14B, and 14C, a gate contact plugs 162 penetrating through the preliminary capping insulating layer 136b and electrically connected to the horizontal gate layers 122 and 131 may be formed. The gate contact plugs 162 may be formed in a first stepped region 114s1 in FIG. 1. A deposition process of depositing the additional capping insulating layer may be performed, and it is possible to form bit line connection vias 164b passing through the additional capping insulating layer and electrically connected to the memory vertical structures 143c, gate connection vias 164g electrically connected to the gate contact plugs 162, and a contact connection via 164c electrically connected to the lower contact plug 157c2. It is possible to form bit lines 168b electrically connected to the bit line connection vias 164b, gate interconnections 168g electrically connected to the gate connection vias 164g, and a contact interconnection 168c electrically connected to the contact connection via 164c.

A capping insulating layer 136 having an increased thickness may be formed by forming an additional capping insulating layer, and it is possible to form an interconnection structure 171 embedded in the capping insulating layer 136 and a second bonding pads 174 on the interconnection structure 171. The capping insulating layer 136 and the second bonding pads 174 may have upper surfaces coplanar with each other.

Again referring to FIG. 8 along with FIGS. 1, 2, 3A, and 3B, the structure formed from the capping insulating layer 136 to the second bonding pads 174 may be bonded to the first structure 3 in FIG. 11 by performing a wafer bonding process and using the method described with reference to FIGS. 12A to 14C. Here, the capping insulating layer 136 may be bonded to the first structure 3 while being in contact with the first insulating structure 21, and the second bonding pads 174 may be bonded thereto while being in contact with the first bonding pads 18.

For example, the pattern structure 109 may be exposed by sequentially removing the substrate base 105 and the insulating layer 107, and an upper insulating layer 177 may be formed on the exposed pattern structure 109.

For another example, the substrate base 105 may be removed, and the insulating layer 107 may remain. Here, the remaining insulating layer 107 may be the upper insulating layer 177.

For still another example, when the substrate base 105 and the insulating layer 107 are omitted, and the pattern structure 109 is formed of a single crystal silicon layer, the pattern structure 109 may be formed to have a reduced thickness, and the upper insulating layer 177 may be formed on the pattern structure having the reduced thickness.

The lower contact structure 157c may be exposed while forming an upper contact hole 180 passing through the upper insulating layer 177 and the pattern structure 109, an upper spacer layer covering an inner wall of the upper contact hole 180 may be formed, the upper spacer layer may be anisotropically etched to form an upper spacer 183c1 exposing the lower contact plug 157c2 of the lower contact structure 157c, and an upper contact plug 183c2 filling the contact hole 180 may be formed. Accordingly, an upper contact structure 183 including the upper spacer 183c1 and the upper contact plug 183c2 may be formed. Accordingly, a contact structure 190 including the upper contact structure 183c and the lower contact structure 157c may be formed. A conductive pattern 193 may be formed on the upper contact structure 183c.

In the example embodiments, the contact structure 190 may be formed to have the same shape as any one of cross-sectional structures as illustrated in FIGS. 3D, 4A, 4B, 4C, and 4D depending on a depth at which the lower contact structure 157c extends into the pattern structure 109, a distance between a side surface of the lower contact structure 157c and a side wall of the upper contact hole 180, and a thickness of the upper spacer layer to form the upper spacer 183c1.

Figure 15:
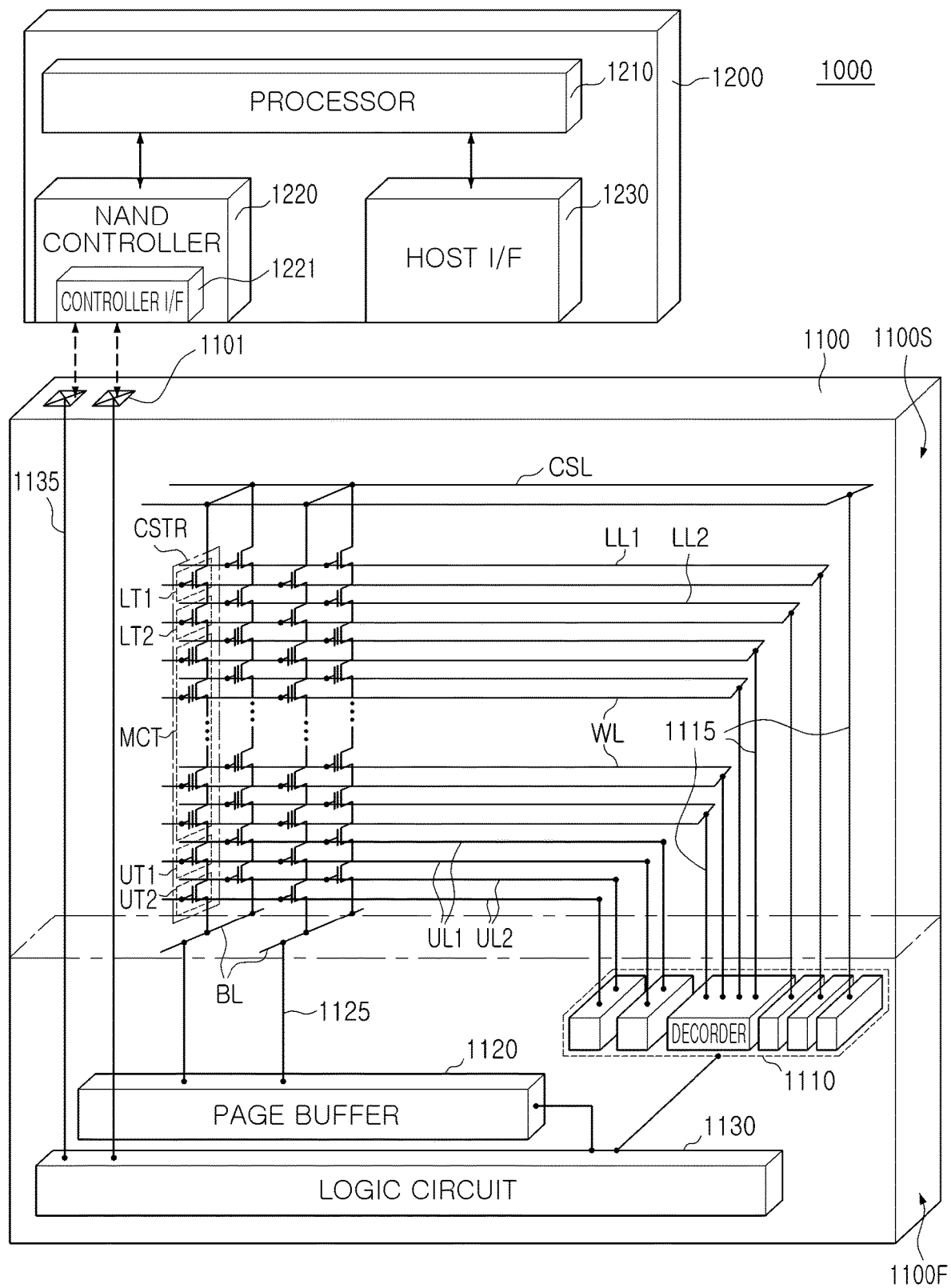
FIG. 15 is a schematic view illustrating a data storage system including a semiconductor device, according to an example embodiment.

Next, an electronic system including a semiconductor device according to an exemplary embodiment is described with reference to FIG. 15. FIG. 15 is a schematic view illustrating the electronic system including the semiconductor device according to an exemplary embodiment.

Referring to FIG. 15, an electronic system 1000 according to an example embodiment may include a semiconductor device 1100 and a controller 1200 electrically connected to the semiconductor device 1100. The electronic system 1000 may be a storage device including one or more semiconductor devices 1100 or an electronic device including the storage device. For example, the electronic system 1000 may be a solid state drive (SSD) device including one or more semiconductor devices 1100, a universal serial bus (USB), a computing system, a medical device, or a communications device.

The semiconductor device 1100 may be a nonvolatile memory device, for example, a semiconductor device according to any one of the example embodiments described with reference to FIGS. 1 to 10. The semiconductor device 1100 may include a first structure 1100F and a second structure 1100S disposed on the first structure 1100F.

In an example embodiment, the first structure 1100F may be the first structure 3 of any one of the example embodiments described with reference to FIGS. 1 to 10, and the second structure 1100S may be the second structure 103, 103a, or 103b of any one of the example embodiments described with reference to FIGS. 1 to 10.

The first structure 1100F may be a peripheral circuit structure including a decoder circuit 1110, a page buffer 1120, and a logic circuit 1130. In an example embodiment, the peripheral circuit 12 of the first structure 3 of any one of the example embodiments described with reference to FIGS. 1 to 10 may be a peripheral circuit structure including the decoder circuit 1110, the page buffer 1120, and the logic circuit 1130.

The second structure 1100S may be a memory vertical structure including bit lines BL, a common source line CSL, word lines WL, first and second gate upper lines UL1 and UL2, and first and second gate lower lines LL1 and LL2, and memory cell strings CSTR disposed between the bit lines BL and the common source line CSL.

In an example embodiment, the bit lines BL may be the bit lines 168b of any one of the example embodiments described with reference to FIGS. 1 to 10.

In an example embodiment, the common source line CSL may be a polysilicon layer having an N-type conductivity in at least a portion of the pattern structure 109.

In an example embodiment, the first and second gate lower lines LL1 and LL2, the word lines WL, and the first and second gate upper lines UL1 and UL2 may be the horizontal gate layers 122 and 131 of the first stack portion 113a of any one of the example embodiments described with reference to FIGS. 1 to 10. Therefore, the horizontal gate layers 122 and 131 of the first stack portion 113a may include the first and second gate lower lines LL1 and LL2, the word lines WL, and the first and second gate upper lines UL1 and UL2. At least some of the first and second gate lower lines LL1 and LL2 and the first and second gate upper lines UL1 and UL2 may be selection gate electrodes.

Each of the memory cell strings CSTR of the second structure 1100S may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously modified based on the example embodiments. The plurality of memory cell transistors MCT may each include data storage region capable of storing information (data). For example, the data storage layer 145b of the data storage structure 145 as described with reference to FIG. 5A may include the data storage region.

In the example embodiments, the upper transistors UT1 and UT2 may each include a string select transistor, and the lower transistors LT1 and LT2 may each include a ground select transistor. The gate lower lines LL1 and LL2 may be respective gate electrodes of the lower transistors LT1 and LT2. The word lines WL may be respective gate electrodes of the memory cell transistors MCT, and the gate upper lines UL1 and UL2 may be respective gate electrodes of the upper transistors UT1 and UT2.

In the example embodiments, the lower transistors LT1 and LT2 may include the lower erase control transistor LT1 and the ground select transistor LT2 connected in series with each other. The upper transistors UT1 and UT2 may include the string select transistor UT1 and the upper erase control transistor UT2 connected in series with each other. At least one of the lower erase control transistor LT1 and the upper erase control transistor UT1 may be used for an erase operation in which data stored in the memory cell transistors MCT is erased using a gate induce drain leakage (GIDL) phenomenon.

The common source line CSL, the first and second gate lower lines LL1 and LL2, the word line WL, and the first and second gate upper lines UL1 and UL2 may each be electrically connected with the decoder circuit 1110 through first interconnections 1115 extending from the inside of the first structure 1100F to the second structure 1100S. The bit line BL may be electrically connected to the page buffer 1120 through second interconnections 1125 extending from the inside of the first structure 1100F to the second structure 1100S.

The decoder circuit 1110 and the page buffer 1120 of the first structure 1100F may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending from the inside of the first structure 1100F to the second structure 1100S.

In an example embodiment, the input/output pad 1101 may be electrically connected to the conductive pattern 193 of any one of the example embodiments described with reference to FIGS. 1 to 10.

In an example embodiment, the input/output connection wirings 1135 may include the contact structures 190, 290, and 390 of any one of the example embodiments described with reference to FIGS. 1 to 10.

The controller 1200 may include a processor 1210, a NAND controller 1220, and a host interface 1230. According to an example embodiment, the electronic system 1000 may include a plurality of semiconductor devices 1100, and in this case, the controller 1200 may control the plurality of semiconductor devices 1100.

The processor 1210 may control an overall operation of the electronic system 1000 including the controller 1200. The processor 1210 may be operated based on predetermined firmware, and may access to the semiconductor device 1100 by controlling the NAND controller 1220. The NAND controller 1220 may include a NAND interface 1221 that processes its communications with the semiconductor device 1100. Through the NAND interface 1221, it is possible to transmit a control command for controlling the semiconductor device 1100, data to be written to the memory cell transistor MCT of the semiconductor device 1100, data to be read from the memory cell transistor MCT of the semiconductor device 1100, etc. The host interface 1230 may provide communications between the electronic system 1000 and an external host. When the control command is received from the external host through the host interface 1230, the processor 1210 may control the semiconductor device 1100 in response to the control command.

Figure 16:
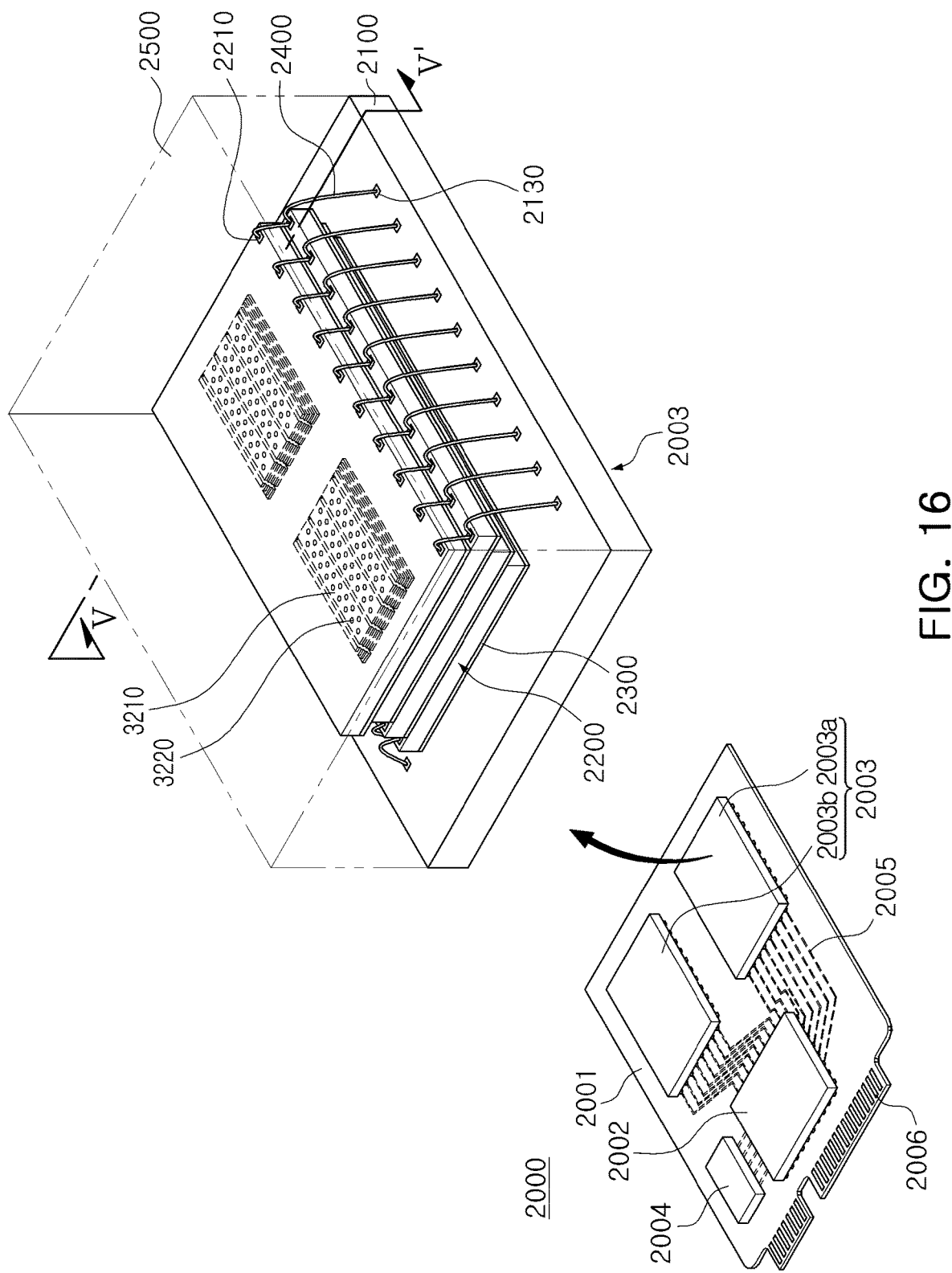
FIG. 16 is a schematic perspective view illustrating the data storage system including the semiconductor device, according to an example embodiment.

The electronic system including a semiconductor device according to another exemplary embodiment is described with reference to FIG. 16. FIG. 16 is a schematic perspective view illustrating the electronic system including the semiconductor device according to another example embodiment.

Referring to FIG. 16, an electronic system 2000 according to an example embodiment may include a main substrate 2001, a controller 2002 mounted on the main substrate 2001, one or more semiconductor packages 2003, and a dynamic random access memory (DRAM) 2004. The semiconductor package 2003 and the DRAM 2004 may be connected to the controller 2002 by a wiring pattern 2005 formed on the main substrate 2001.

The main substrate 2001 may include a connector 2006 including a plurality of pins coupled to an external host. The number and arrangement of the plurality of pins on the connector 2006 may depend on a communications interface between the electronic system 2000 and the external host. In the example embodiments, the electronic system 2000 may communicate with the external host based on any one of the interfaces such as a universal serial bus (USB), a peripheral component interconnect (PCI)-express, a serial advanced technology attachment (SATA), and an M-physostigmine (phy) for a universal flash storage (UFS). In the example embodiments, the electronic system 2000 may be operated by power supplied from the external host through the connector 2006. The electronic system 2000 may further include a power management integrated circuit (PMIC) that distributes the power supplied from the external host to the controller 2002 and the semiconductor package 2003.

The controller 2002 may write data to the semiconductor package 2003 or read data from the semiconductor package 2003, and may improve an operation speed of the electronic system 2000.

The DRAM 2004 may be a buffer memory to mitigate a difference in speed between the semiconductor package 2003, which is a data storage space, and the external host. The DRAM 2004 included in the electronic system 2000 may also be operated as a type of a cache memory, and may provide a space for temporarily storing data during an operation of controlling the semiconductor package 2003. When the DRAM 2004 is included in the electronic system 2000, the controller 2002 may further include a DRAM controller controlling the DRAM 2004 in addition to the NAND controller controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include: a package substrate 2100; the semiconductor chips 2200 disposed on the package substrate 2100; an adhesive layer 2300 disposed on a lower surface of each of the semiconductor chips 2200; a connection structure 2400 electrically connecting the semiconductor chips 2200 and the package substrate 2100 to each other; and a molding layer 2500 disposed on the package substrate 2100 and covering the semiconductor chips 2200 and the connection structure 2400.

The package substrate 2100 may be a printed circuit board including a package upper pad 2130. Each of the semiconductor chips 2200 may include an input/output pad 2210. The input/output pad 2210 may correspond to the input/output pad 1101 of FIG. 15. Each of the semiconductor chips 2200 may include stack structures 3210 and memory vertical structures 3220. Each of the semiconductor chips 2200 may include the semiconductor device of any one of the example embodiments described with reference to FIGS. 1 to 10. The stack structure 3210 may be the stack structure 113 of any one of the example embodiments described with reference to FIGS. 1 to 10. The memory vertical structures 3220 may be the memory vertical structures 143c or 143c' of any one of the example embodiments described with reference to FIGS. 1 to 10.

In the example embodiments, the connection structure 2400 may be a bonding wire electrically connecting the input/output pad 2210 and the upper pad 2130 of the package to each other. Accordingly, the semiconductor chips 2200 of each of the first and second semiconductor packages 2003a and 2003b may be electrically connected to each other by a bonding wire method, and may each be electrically connected to the package upper pad 2130 of the package substrate 2100. According to an example embodiment, the semiconductor chips 2200 of each of the first and second semiconductor packages 2003a and 2003b may also be electrically connected to each other by a connection structure including a through electrode (e.g., through silicon via (TSV)), instead of the bonding wire type connection structure 2400.

In the example embodiments, the controller 2002 and the semiconductor chip 2200 may be included in one package. In an example embodiment, the controller 2002 and the semiconductor chips 2200 may be mounted on a separate interposer substrate different from the main substrate 2001, and the controller 2002 and the semiconductor chips 2200 may be connected to each other by a wiring formed on the interposer substrate.

Figure 17:
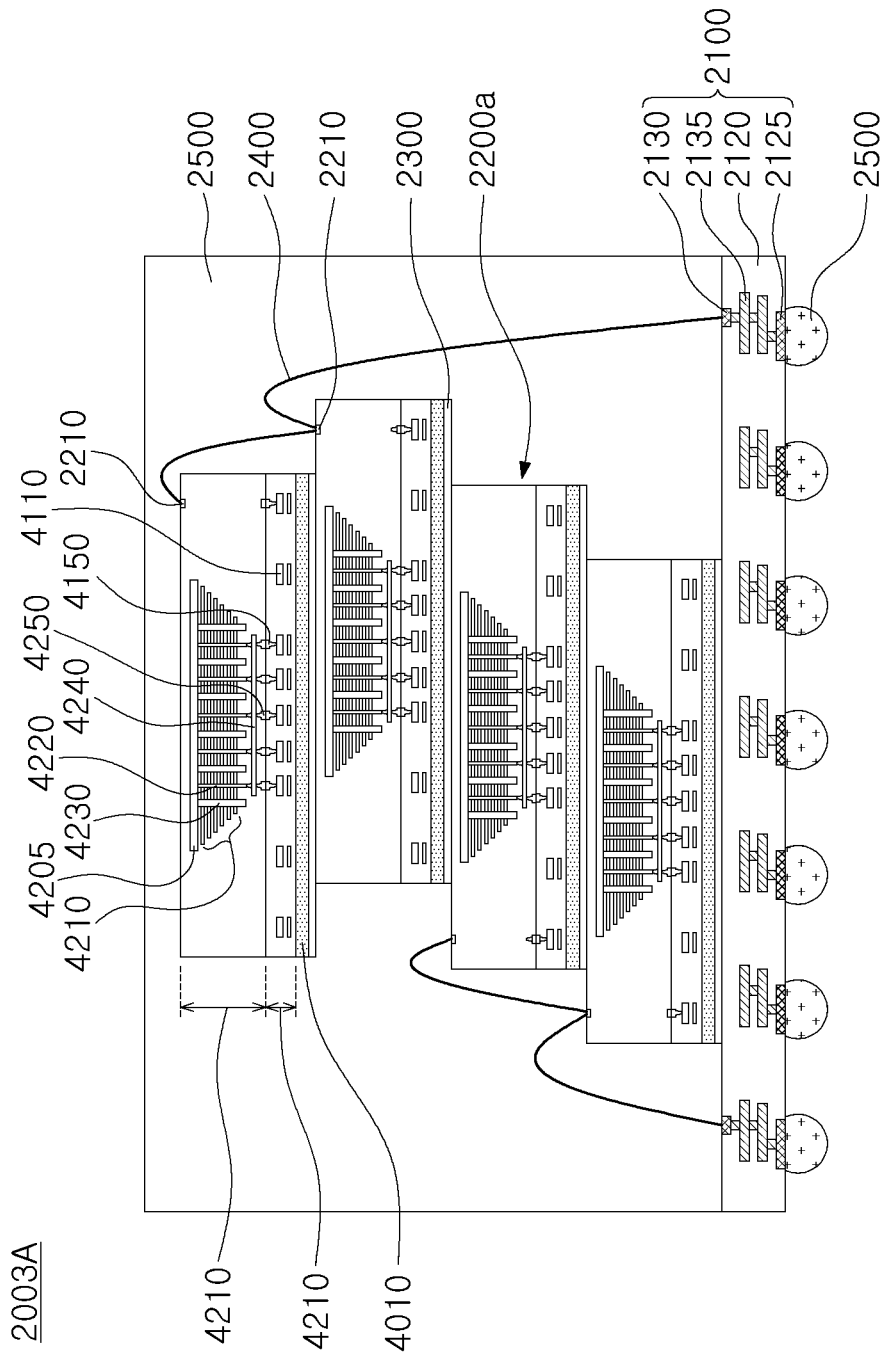
FIG. 17 is a schematic cross-sectional view illustrating the data storage system including the semiconductor device, according to an example embodiment.

FIG. 17 is a schematic cross-sectional view illustrating a semiconductor package according to an exemplary embodiment. FIG. 17 illustrates an example embodiment of the semiconductor package 2003 of FIG. 16, and conceptually illustrates a region cut along a cutting line V-V' of the semiconductor package 2003 of FIG. 16.

Referring to FIG. 17, each of the semiconductor chips 2200a of the semiconductor package 2003A may include a semiconductor substrate 4010 and a first structure 4100 disposed on the semiconductor substrate 4010, and a second structure 4200 disposed on the first structure 4100 and bonded to the first structure 4100 by the wafer bonding method.

In an example embodiment, the first structure 4100 may be the first structure 3 of any one of the example embodiments described with reference to FIGS. 1 to 10 and/or the first structure 1100F described with reference to FIG. 15, and the second structure 4200 may be the second structure 103, 103a, or 103b of any one of the example embodiments described with reference to FIGS. 1 to 10 and/or the second structure 1100S described with reference to FIG. 15.

The first structure 4100 may include a peripheral circuit region including a peripheral wiring 4110 and first bonded structures 4150. The second structure 4200 may include: a common source line 4205; a gate stack structure 4210 disposed between the common source line 4205 and the first structure 4100; memory vertical structures 4220 and separation structures 4230 which penetrate through the gate stack structure 4210; and second bonded structures 4250 electrically connected to each of the word lines (e.g., the word lines WL in FIG. 15) of the gate stack structure 4210 and the memory vertical structure 4220. For example, the second bonded structures 4250 may be electrically connected to each of the memory vertical structures 4220 and the word lines (e.g., the word lines WL in FIG. 15) through bit lines 4240 electrically connected to the memory vertical structures 4220 and the gate interconnections (e.g., the gate interconnections 168g in FIG. 3B) electrically connected to the word lines (e.g., the word lines WL in FIG. 15). The first bonded structures 4150 of the first structure 4100 and the second bonded structures 4250 of the second structure 4200 may be bonded to each other while being in contact with each other. A portion in which the first bonded structures 4150 and the second bonded structures 4250 are bonded to each other may be formed of, for example, copper (Cu).

In an example embodiment, the gate stack structure 4210 may be the stack structure 113 of any one of the example embodiments described with reference to FIGS. 1 to 10.

In an example embodiment, the memory vertical structures 4220 may be the memory vertical structures 143c or 143c' of any one of the example embodiments described with reference to FIGS. 1 to 10.

In an example embodiment, the separation structures 4230 may be the separation structures 157s of any one of the example embodiments described with reference to FIGS. 1 to 10.

In an example embodiment, the first bonded structures 4150 may include the first bonding pads 18 of any one of the example embodiments described with reference to FIGS. 1 to 10, and the second bonded structures 4250 may include the second bonding pads 174 of any one of the example embodiments described with reference to FIGS. 1 to 10.

Each of the semiconductor chips 2200a may further include the input/output pad 2210. The input/output pad 2210 may be electrically connected to the conductive pattern 193 of any one of the example embodiments described with reference to FIGS. 1 to 10. The semiconductor chips 2200a may be electrically connected to each other by the bonding wire type connection structure 2400. However, in the example embodiments, semiconductor chips in one semiconductor package, such as the semiconductor chips 2200a, may be electrically connected to each other by the connection structure including the through electrode (through silicon via, TSV).

As set forth above, the example embodiments may provide the semiconductor device having improved integration and reliability and the data storage system including the same. For example, it is possible to penetrate through the horizontal conductive layers formed simultaneously as the word lines, and to provide the contact structure formed simultaneously as the separation structures. Accordingly, it is thus possible to form the contact structure more stably and minimize the space occupied by the contact structure, thereby improving a degree of integration of the semiconductor device. As a result, the semiconductor device may have the improved integration density and reliability.

The various and beneficial advantages and effects of the present inventive concept are not limited to the above description, and more easily understood in the process of explaining the specific example embodiments.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
 a first structure including a peripheral circuit; and
 a second structure disposed on the first structure and bonded to the first structure,
 wherein the second structure includes:
  a pattern structure including a polysilicon layer;
  an upper insulating layer disposed on the pattern structure;

a stack structure disposed between the first structure and the pattern structure and including a first stack portion and a second stack portion spaced apart from each other in a horizontal direction, the first and second stack portions respectively including horizontal conductive layers and interlayer insulating layers alternately stacked in a vertical direction;

separation structures penetrating through the stack structure and separating the stack structure;

memory vertical structures penetrating through the first stack portion of the stack structure;

bit lines below the memory vertical structures and electrically connected to the memory vertical structures, and a contact structure penetrating through the second stack portion of the stack structure, the pattern structure, and the upper insulating layer, wherein the contact structure includes:

a lower contact plug penetrating through at least the second stack portion of the stack structure and spaced apart from the horizontal conductive layers of the second stack portion; and an upper contact plug in contact with the lower contact plug and extending upwardly to penetrate through the pattern structure and the upper insulating layer, wherein the polysilicon layer of the pattern structure is spaced apart from the lower contact plug and the upper contact plug and is in contact with the separation structures, and wherein the bit lines are not electrically connected to the contact structure and the separation structures.

2. The semiconductor device of claim 1, wherein the upper contact plug is in contact with an upper surface of the lower contact plug and a side surface of the lower contact plug, adjacent to the upper surface thereof.

3. The semiconductor device of claim 2, wherein the lower contact plug further includes a portion extending into the pattern structure from a portion penetrating through the second stack portion of the stack structure, and wherein the upper surface of the lower contact plug is disposed at a height level between a lower surface of the pattern structure and an upper surface of the pattern structure.

4. The semiconductor device of claim 3, wherein a height difference between the upper surface of the lower contact plug and the lower surface of the pattern structure is smaller than a height difference between the upper surface of the lower contact plug and the upper surface of the pattern structure.

5. The semiconductor device of claim 1, wherein the contact structure further includes an insulating lower spacer covering a side surface of the lower contact plug, and an insulating upper spacer covering a side surface of the upper contact plug, and wherein a thickness of the insulating upper spacer in the horizontal direction is greater than a thickness of the insulating lower spacer in the horizontal direction.

6. The semiconductor device of claim 1, wherein the contact structure further includes an insulating lower spacer covering a side surface of the lower contact plug, wherein each of the separation structures includes a conductive separation pattern and an insulating separation spacer covering a side surface of the conductive separation pattern, wherein the lower contact plug includes a first liner layer and a first pillar pattern, wherein the conductive separation pattern includes a second liner layer formed of the same material as the first liner layer and a second pillar pattern formed of the same material as the first pillar pattern, wherein the first liner layer covers at least a side surface of the first pillar pattern, and wherein the second liner layer covers a side surface of the second pillar pattern and an upper surface of the second pillar pattern.

7. The semiconductor device of claim 6, wherein the first liner layer includes a portion interposed between the first pillar pattern and the upper contact plug, and wherein the first pillar pattern is spaced apart from the upper contact plug.

8. The semiconductor device of claim 6, wherein the first pillar pattern is in contact with the upper contact plug.

9. The semiconductor device of claim 1, wherein the first structure includes first bonding pads, and wherein the second structure further includes:

gate contact plugs disposed under the stack structure and electrically connected to word lines and selection gate electrodes of the horizontal conductive layers of the first stack portion;

bit lines disposed between the memory vertical structures and the first structure, and electrically connected to the memory vertical structures;

gate interconnections disposed between the gate contact plugs and the first structure, and electrically connected to the gate contact plugs;

a contact interconnection disposed between the contact structure and the first structure, and electrically connected to the lower contact plug;

second bonding pads in contact with and bonded to the first bonding pads; and an interconnection structure electrically connecting the second bonding pads with the bit lines, the gate interconnections, and the contact interconnection.

10. The semiconductor device of claim 9, wherein the first stack portion includes a first stacked region and a second stacked region disposed on the first stacked region, wherein the first stacked region includes a plurality of first horizontal conductive layers of the horizontal conductive layers, wherein the second stacked region includes a plurality of second horizontal conductive layers of the horizontal conductive layers, and wherein a side surface of at least one of the memory vertical structures has a bent portion between the plurality of first horizontal conductive layers and the plurality of second horizontal conductive layers.

11. The semiconductor device of claim 1, wherein one of the separation structures is disposed between the first stack portion and the second stack portion.

12. The semiconductor device of claim 1, wherein the second structure further includes a capping insulating layer, wherein the stack structure includes a first stack structure including the first stack portion and a dummy stack structure including the second stack portion, wherein the memory vertical structures do not penetrate through the dummy stack structure, and wherein at least a portion of the capping insulating layer is disposed between the first stack structure and the dummy stack structure.

13. The semiconductor device of claim 1,
wherein the pattern structure has a lower surface facing the first structure and an upper surface opposing the lower surface,
wherein each of the separation structures includes a conductive separation pattern and an insulating separation spacer covering a side surface of the conductive separation pattern,
wherein the conductive separation pattern of at least one of the separation structures further includes a portion extending into the pattern structure from a portion penetrating through the stack structure,
wherein the conductive separation pattern has an upper surface disposed at a height level between an upper surface of the pattern structure and a lower surface of the pattern structure, and
wherein a height difference between the upper surface of the conductive separation pattern and the lower surface of the pattern structure is greater than a height difference between an upper surface of the lower contact plug and a lower surface of the pattern structure.

14. The semiconductor device of claim 1,
wherein the second structure further includes:
 bit lines disposed between the stack structure and the first structure; and
 dummy vertical structures penetrating through the second stack portion, and
wherein the bit lines are electrically connected to the memory vertical structures, and are not electrically connected to the dummy vertical structures.

15. A semiconductor device comprising:
a first structure including a peripheral circuit; and
a second structure disposed on the first structure and bonded to the first structure,
wherein the second structure includes:
 a pattern structure including a polysilicon layer;
 an upper insulating layer disposed on the pattern structure;
 word lines disposed between the pattern structure and the first structure, stacked in a vertical direction and spaced apart from each other;
 dummy horizontal conductive layers disposed between the pattern structure and the first structure, stacked in the vertical direction and spaced apart from each other;
 memory vertical structures penetrating through the word lines in the vertical direction and in contact with the pattern structure;
 bit lines below the memory vertical structures and electrically connected to the memory vertical structures;
 separation structures penetrating through the word lines in the vertical direction and in contact with the pattern structure; and
 a contact structure penetrating through the dummy horizontal conductive layers, the pattern structure, and the upper insulating layer in the vertical direction,
wherein the dummy horizontal conductive layers are electrically isolated from the contact structure,
wherein the contact structure includes a lower contact structure and an upper contact structure,
wherein the lower contact structure includes a lower contact plug penetrating through at least the dummy horizontal conductive layers,
wherein the upper contact structure includes an upper contact plug in contact with the lower contact plug and extending upwardly to penetrate through the pattern structure,
wherein the lower contact plug is spaced apart from the dummy horizontal conductive layers,
wherein the polysilicon layer of the pattern structure is spaced apart from the lower contact plug and the upper contact plug and is in contact with the separation structures, and
wherein the bit lines are not electrically connected to the contact structure and the separation structures.

16. The semiconductor device of claim 15,
wherein each of the separation structures includes a conductive separation pattern and an insulating separation spacer covering a side surface of the conductive separation pattern,
wherein the lower contact structure further includes an insulating lower spacer surrounding at least a side surface of the lower contact plug,
wherein the upper contact structure further includes an insulating upper spacer surrounding a side surface of the upper contact plug,
wherein the upper contact plug is in contact with an upper surface of the lower contact plug and the side surface of the lower contact plug, adjacent to the upper surface thereof, and
wherein each of the conductive separation pattern and the lower contact plug includes a pillar pattern and a liner layer covering at least a side surface of the pillar pattern.

17. The semiconductor device of claim 15,
wherein the second structure further includes dummy vertical structures penetrating through the dummy horizontal conductive layers and spaced apart from each other, and
wherein the dummy vertical structures are arranged to surround a portion of the contact structure penetrating through the dummy horizontal conductive layers.

18. A data storage system comprising:
a semiconductor device; and
a controller electrically connected to the semiconductor device,
wherein the semiconductor device includes:
 a first structure including a peripheral circuit; and
 a second structure disposed on the first structure and bonded to the first structure,
wherein the second structure includes:
 a pattern structure including a polysilicon layer;
 an upper insulating layer disposed on the pattern structure;
 word lines disposed between the pattern structure and the first structure, and
stacked in a vertical direction;
 dummy horizontal conductive layers disposed between the pattern structure and
the first structure, and stacked in the vertical direction;
 memory vertical structures penetrating through the word lines in the vertical direction and in contact with the pattern structure;
 separation structures penetrating through the word lines in the vertical direction and in contact with the pattern structure; and a contact structure penetrating through the dummy horizontal conductive layers, the pattern structure, and the upper insulating layer in the vertical direction, wherein the dummy horizontal conductive layers are electrically isolated from the contact structure, wherein the contact structure includes a lower contact structure and an upper contact structure, wherein the lower contact structure includes a lower contact plug penetrating through at least the dummy horizontal conductive layers, wherein the upper contact structure includes an upper contact plug in contact with the lower contact plug and extending upwardly to penetrate through the pattern structure, wherein the lower contact plug is spaced apart from the dummy horizontal conductive layers, and wherein the polysilicon layer of the pattern structure is spaced apart from the lower contact plug and the upper contact plug and is in contact with the separation structures.

19. The data storage system of claim 18, wherein the second structure further includes dummy vertical structures penetrating through the dummy horizontal conductive layers and spaced apart from each other, wherein each of the separation structures includes a conductive separation pattern and an insulating separation spacer covering a side surface of the conductive separation pattern, wherein the lower contact structure further includes an insulating lower spacer surrounding at least a side surface of the lower contact plug, wherein the upper contact structure further includes an insulating upper spacer surrounding a side surface of the upper contact plug, wherein the upper contact plug is in contact with an upper surface of the lower contact plug and the side surface of the lower contact plug, adjacent to the upper surface thereof, and wherein each of the conductive separation pattern and the lower contact plug includes a pillar pattern and a liner layer covering at least a side surface of the pillar pattern.

20. The data storage system of claim 18, wherein the lower contact structure further includes an insulating lower spacer surrounding at least a side surface of the lower contact plug, wherein the upper contact structure further includes an insulating upper spacer surrounding a side surface of the upper contact plug, wherein the first structure includes first bonding pads, wherein the second structure further includes:
  an input/output pad disposed on the upper insulating layer and electrically connected to the contact structure;
  gate contact plugs disposed between the word lines and the first structure and electrically connected to the word lines;
  bit lines disposed between the memory vertical structures and the first structure, and electrically connected to the memory vertical structures;
  gate interconnections disposed between the gate contact plugs and the first structure, and electrically connected to the gate contact plugs;
  a contact interconnection disposed between the contact structure and the first structure, and electrically connected to the lower contact plug;
  second bonding pads in contact with and bonded to the first bonding pads; and
  an interconnection structure electrically connecting the second bonding pads with the bit lines, the gate interconnections, and the contact interconnection, wherein each of the memory vertical structures includes the a data storage layer, and wherein the semiconductor device is electrically connected to the controller through the input/output pad.

* * * * *